US007683422B2

(12) United States Patent
Lee et al.

(10) Patent No.: US 7,683,422 B2
(45) Date of Patent: Mar. 23, 2010

(54) NON-VOLATILE MEMORY DEVICES WITH WRAPAROUND-SHAPED FLOATING GATE ELECTRODES AND METHODS OF FORMING SAME

(75) Inventors: Woon-Kyung Lee, Gyeonggi-do (KR); Jeong-Hyuk Choi, Gyeonggi-do (KR); Jai-Hyuk Song, Seoul-si (KR)

(73) Assignee: Samsung Electronics Co., Ltd. (KR)

( * ) Notice: Subject to any disclaimer, the term of this patent is extended or adjusted under 35 U.S.C. 154(b) by 623 days.

(21) Appl. No.: 11/464,324

(22) Filed: Aug. 14, 2006

(65) Prior Publication Data
US 2007/0090445 A1 Apr. 26, 2007

(30) Foreign Application Priority Data
Oct. 24, 2005 (KR) ............. 10-2005-0100411

(51) Int. Cl.
H01L 29/788 (2006.01)
(52) U.S. Cl. .............. 257/315; 257/390; 257/E27.103; 257/E29.129
(58) Field of Classification Search ............ 257/315, 257/390, E21.682, E27.103, E29.129; 438/211
See application file for complete search history.

(56) References Cited

U.S. PATENT DOCUMENTS

| 5,793,080 | A |   | 8/1998 | Hwang |           |
|-----------|---|---|--------|-------|-----------|
| 5,916,821 | A | * | 6/1999 | Kerber | ..... 438/696 |
| 5,973,354 | A | * | 10/1999 | Chang | ..... 257/315 |
| 6,417,538 | B1 |   | 7/2002 | Choi |           |
| 6,465,833 | B1 | * | 10/2002 | Jung et al. | ..... 257/314 |
| 6,498,064 | B2 |   | 12/2002 | Tseng |           |
| 6,720,218 | B2 |   | 4/2004 | Jang |           |
| 6,737,320 | B2 |   | 5/2004 | Chen et al. |           |
| 6,746,920 | B1 |   | 6/2004 | Wen et al. |           |
| 6,875,660 | B2 |   | 4/2005 | Hung et al. |           |
| 7,037,784 | B1 | * | 5/2006 | Hong | ..... 438/257 |

FOREIGN PATENT DOCUMENTS

| DE | 4335834 A | 5/1995 |
| JP | 2002-368139 | 12/2002 |
| JP | 2003-318287 A | 11/2003 |
| JP | 2004-214495 | 7/2004 |
| KR | 10-1997-0072441 A | 11/1997 |
| KR | 100172274 B1 | 10/1998 |
| KR | 10-2000-0009373 A | 2/2000 |
| KR | 1020040045110 A | 6/2004 |
| KR | 1020040063820 A | 7/2004 |

OTHER PUBLICATIONS

Lee et al., "Effects of Floating-Gate Interference on NAND Flash Memory Cell Operation," IEEE Electron Device Letters, vol. 23, No. 5, May 2002, pp. 264-266.

* cited by examiner

Primary Examiner—Tuan N. Quach
(74) Attorney, Agent, or Firm—Myers Bigel Sibley & Sajovec

(57) ABSTRACT

Non-volatile memory devices include memory cells therein with reduced cell-to-cell coupling capacitance. These memory cells include floating gate electrodes with open-ended wraparound shapes that operate to reduce the cell-to-cell coupling capacitance in a bit line direction, while still maintaining a high coupling ratio between control and floating gate electrodes within each memory cell.

5 Claims, 22 Drawing Sheets

NON-VOLATILE MEMORY DEVICES WITH WRAPAROUND-SHAPED FLOATING GATE ELECTRODES AND METHODS OF FORMING SAME

REFERENCE TO PRIORITY APPLICATION

This application claims priority under 35 USC §119 to Korean Application Serial No. 2005-0100411, filed Oct. 24, 2005, the disclosure of which is hereby incorporated herein by reference.

FIELD OF THE INVENTION

The present invention relates to integrated circuit memory devices and methods of forming same and, more particularly, to non-volatile memory devices and methods of forming non-volatile memory devices.

BACKGROUND OF THE INVENTION

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

One category of EEPROM devices includes NAND-type flash memories, which can provide a low cost and high capacity alternative to other forms of nonvolatile memory. A typical NAND-type flash memory includes a plurality of NAND-type strings therein that are disposed side-by-side in a semiconductor substrate. Each EEPROM cell within a NAND-type string includes a floating gate electrode and a control gate electrode, which is electrically connected to a respective word line. These EEPROM cells may be cells that support a single or a multi-level programmed state. EEPROM cells that support only a single programmed state are typically referred to as single level cells (SLC). In particular, an SLC may support an erased state, which may be treated as a logic 1 storage value, and a programmed state, which may be treated as a logic 0 storage value. The SLC may have a negative threshold voltage (Vth) when erased (e.g., −3V<Vth<−1V) and a positive threshold voltage when programmed (e.g., 1V<Vth<3V).

The state of an EEPROM cell may be detected by performing a read operation on a selected cell. As will be understood by those skilled in the art, a NAND string will operate to discharge a precharged bit line BL when a selected cell is in an erased state and a selected word line voltage (e.g., 0 Volts) is greater than the threshold voltage of the selected cell. However, when a selected cell is in a programmed state, the corresponding NAND string will provide an open circuit to the precharged bit line because the selected word line voltage (e.g., 0 Volts) is less than the threshold voltage of the selected cell and the selected cell remains "off". Other aspects of NAND-type flash memories are disclosed in U.S. application Ser. No. 11/358,648, filed Feb. 21, 2006, and in an article by Jung et al., entitled "A 3.3 Volt Single Power Supply 16-Mb Nonvolatile Virtual DRAM Using a NAND Flash Memory Technology," IEEE Journal of Solid-State Circuits, Vol. 32, No. 11, pp. 1748-1757, November (1997), the disclosures of which are hereby incorporated herein by reference.

Operations to program or erase an EEPROM cell may include the application of a relatively high program or erase voltage to the control electrode or channel region of the EEPROM cell, respectively. As will be understood by those skilled in the art, the magnitude of a program voltage should be sufficient to attract a sufficient number of electrons to a floating gate electrode within the cell and the magnitude of the erase voltage should be sufficient to withdraw a high percentage of accumulated electrons from the floating gate electrode. These operations to attract electrons to the floating gate electrode or withdraw electrons from the floating gate electrode result in a change in a threshold voltage of the EEPROM cell. In particular, operations to program an EEPROM cell may result in an increase in the threshold voltage of the EEPROM cell and operations to erase an EEPROM cell may result in a decrease in the threshold voltage of the EEPROM cell, as described above for both single and multi-level cells.

Unfortunately, as EEPROM devices become more highly integrated on a semiconductor substrate, the parasitic capacitance between floating gate electrodes of closely adjacent EEPROM cells may increase. As illustrated by FIGS. 1A-1C, this parasitic capacitance is directly proportional to the area of overlap between adjacent floating gate electrodes and inversely proportional to the lateral distance between adjacent floating gate electrodes. This lateral distance is typically reduced as the level of device integration increases. In particular, FIG. 1A illustrates an array of NAND-type EEPROM devices, which includes a plurality of floating gate electrodes 19 spaced side-by-side in two dimensions (e.g., row and column directions). These floating gate electrodes 19 are separated from active regions 13 of a semiconductor substrate 11 by tunnel insulating layers 17. These active regions 13 are defined by spaced-apart trench isolation regions 15. The control electrodes of each EEPROM cell within a row are commonly connected to respective word lines 23 (shown as word lines A, B and C). Each floating gate electrode 19 is separated from a corresponding word line by an inter-gate dielectric layer 21. As illustrated by FIGS. 1B-1C, the floating gate electrodes 19 are spaced apart from each other in a bit line direction by source/drain regions 25 and are spaced apart from each other in a word line direction by the trench isolation regions 15. The area of overlap between each floating gate electrode in the bit line direction is equivalent to the product $h_1 W_1$ and the area of overlap between each floating gate electrode in the word line direction is equivalent to the product $h_1 \times W_2$.

These increases in parasitic capacitance caused by higher device integrated levels can result in a corresponding increase in floating gate interference. If this interference is sufficiently high, then the programming of one EEPROM cell may result in a threshold voltage shift of one or more closely adjacent EEPROM cells in the neighborhood of the EEPROM cell undergoing programming. Such shifts in threshold voltage can reduce memory device reliability by causing bit errors to occur during data reading operations. These and other consequences of increased parasitic capacitance between floating gate electrodes are described in an article by Jae-Duk Lee et al. entitled "Effects of Floating-Gate Interference on NAND Flash Memory Cell Operation," IEEE Electron Device Letters, Vol. 23, No. 5, pp. 264-266, May (2002).

SUMMARY OF THE INVENTION

Embodiments of the invention include non-volatile memory devices having memory cells therein with reduced cell-to-cell coupling capacitance. According to some of these embodiments, non-volatile memory devices, such as NAND-type flash EEPROM devices, include memory cells with floating gate electrodes. These floating gate electrodes are formed to have an open-ended wraparound shape that operates to reduce parasitic cell-to-cell coupling capacitance in a bit line direction while maintaining a high coupling ratio between control and floating gate electrodes within each memory cell. In particular, each memory cell may include an EEPROM transistor therein. Each of these EEPROM transistors includes a tunneling insulating layer on a semiconductor channel region and a floating gate electrode on the tunneling insulating layer. The floating gate electrode has an open-ended wraparound shape that is filled with an electrically insulating region. According to some of these embodiments, the floating gate electrode may be shaped as a rectangular cylinder with a hollow center that is filled with the electrically insulating region.

According to still further embodiments of the invention, a non-volatile memory array includes a semiconductor substrate and at least one NAND-string of EEPROM cells in the semiconductor substrate. The at least one NAND-string of EEPROM cells includes a first non-volatile memory cell having a first open-ended and insulator-filled wraparound-shaped floating gate electrode therein and a second non-volatile memory cell having a second open-ended and insulator-filled wraparound-shaped floating gate electrode therein. The floating gate electrodes are configured so that a longitudinal axis of the first open-ended wraparound-shaped floating gate electrode is collinear with a longitudinal axis of the second open-ended wraparound-shaped floating gate electrode. The at least one NAND-string of EEPROM cells may also include a string selection transistor having a third open-ended insulator-filled wraparound-shaped gate electrode therein and a ground selection transistor having a fourth open-ended insulator-filled wraparound-shaped gate electrode therein. In these embodiments, a word line associated with the first non-volatile memory cell is separated from the first open-ended and insulator-filled wraparound-shaped floating gate electrode by a first inter-gate dielectric layer and a word line associated with the string selection transistor is electrically shorted to the third open-ended and insulator-filled wraparound-shaped floating gate electrode.

Still further embodiments of the invention include a method of forming a non-volatile memory array by forming a semiconductor substrate having first and second trench isolation regions therein that are spaced apart from each other by a semiconductor active region. A tunnel insulating layer is formed on the active region and then a first conductive layer is formed on sidewalls of the first and second trench isolation regions and on the tunnel insulating layer. An insulating region is formed on a portion of the first conductive layer extending opposite the tunnel insulating layer. A second conductive layer is then formed on the insulating region. The second conductive layer, the insulating region and the first conductive layer are then patterned in sequence to define an insulator-filled wraparound-shaped floating gate electrode.

According to further aspects of these embodiments, the patterning step may be preceded by the steps of forming an inter-gate dielectric layer on the second conductive layer and forming a third electrode layer on the inter-gate dielectric layer. The patterning step may also be preceded by a step of forming a contact hole that extends through the inter-gate dielectric layer and exposes the second conductive layer. In this case, the step of forming a third electrode layer may include depositing the third electrode layer into the contact hole. The patterning step may further include patterning the third conductive layer, the inter-gate dielectric layer, the second conductive layer, the insulating region and the first conductive layer in sequence to define a string selection line (SSL) including a first portion of the patterned third conductive layer and an underlying first portion of the patterned second conductive layer that is electrically connected to the first portion of the patterned third conductive layer at the location of the contact hole.

According to still further embodiments of the invention, the patterning step may be followed by the step of removing the patterned insulating region from the wraparound-shaped floating gate electrode. The removing step is followed by a step of depositing a dielectric layer onto the semiconductor substrate to thereby refill an interior of the wraparound-shaped floating gate with an electrically insulating material. This electrically insulating material may have a relatively low dielectric constant (e.g., lower dielectric constant relative to the patterned insulating region that is removed).

DETAILED DESCRIPTION OF PREFERRED EMBODIMENTS

Figure 1A:
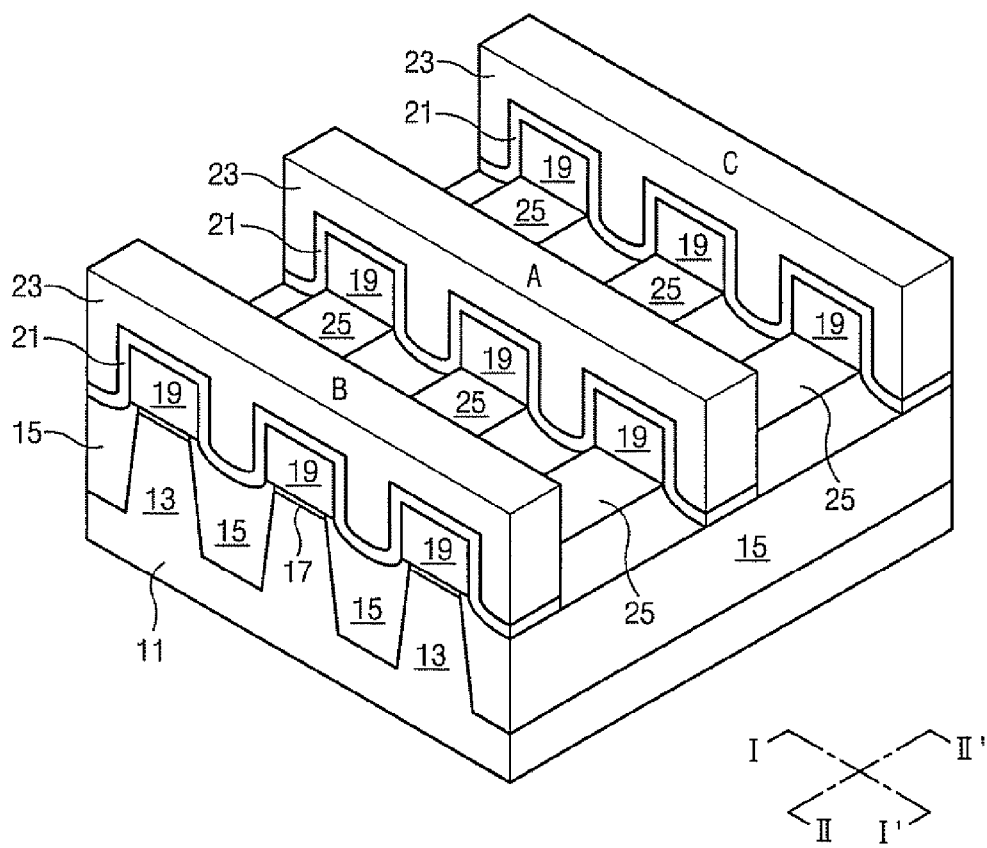
FIG. 1A is a perspective view of a conventional NAND-type EEPROM device.
Figure 1B:
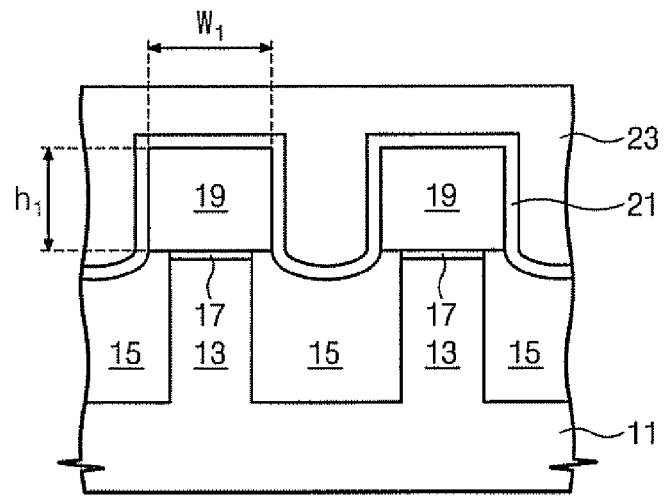
FIG. 1B is a cross-sectional view of a portion of the NAND-type EEPROM device of FIG. 1A, taken along the word line direction I-I' in FIG. 1A.
Figure 1C:
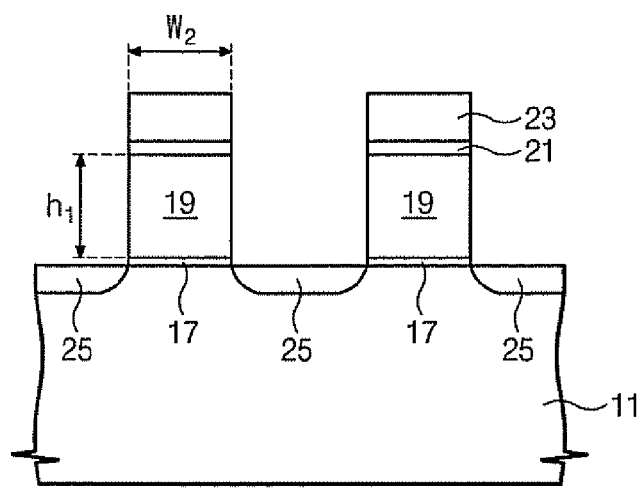
FIG. 1C is a cross-sectional view of a portion of the NAND-type EEPROM device of FIG. 1A, taken along the bit line direction II-II' in FIG. 1A.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 2A:
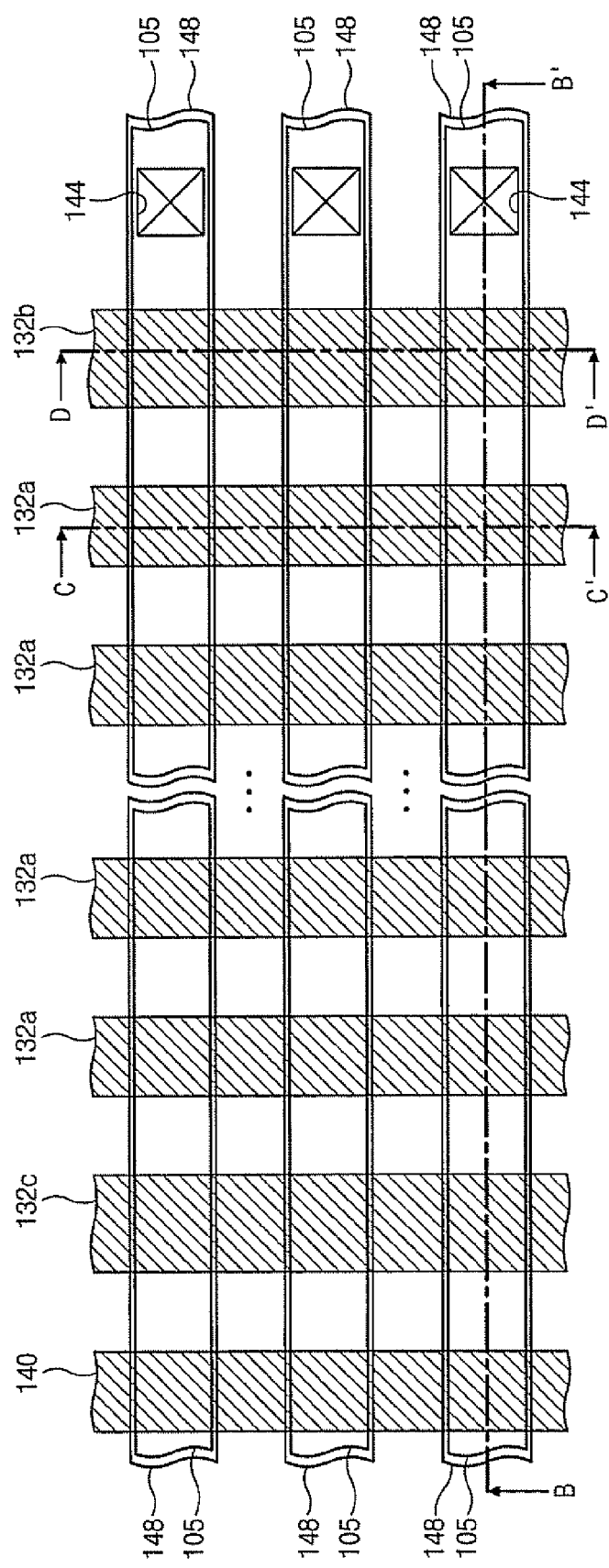
FIG. 2A is a plan layout view of a NAND-type EEPROM device according to embodiments of the present invention.
Figure 2B:
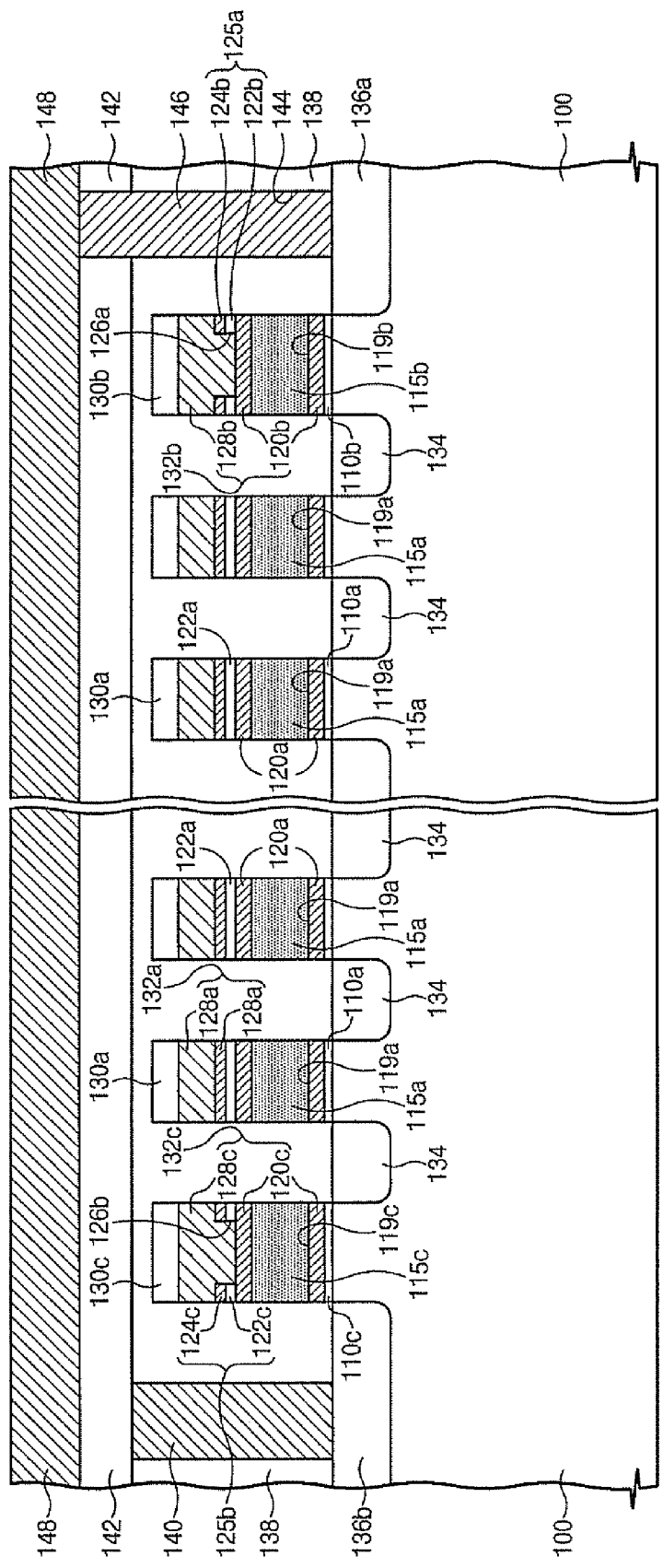
FIG. 2B is a cross-sectional view of the NAND-type EEPROM device of FIG. 2A, taken along the line B-B' in FIG. 2A.

A NAND-type EEPROM device according to first embodiments of the invention is illustrated by FIGS. 2A-2D. In particular, FIG. 2A, which is a plan layout view of a NAND-type EEPROM device, illustrates a plurality of bit lines 148 that extend in parallel in a first direction across a semiconductor substrate 100 having active regions 105 therein. As shown by FIG. 2B, these active regions 105 extend between adjacent trench isolation regions 106, which are located within shallow trenches 104. These bit lines 148 are connected vertically by bit line contact plugs 146 to corresponding ones of the active regions 105. These bit line contact plugs 146 are formed within contact openings 144. FIG. 2A also illustrates a plurality of word lines 132a, a string select line 132b, a ground select line 132c and a common source line 140, which extend in parallel in a second direction across the semiconductor substrate 100. These first and second directions are illustrated as the bit line direction and the word line direction, respectively.

FIG. 2B illustrates a cross-sectional view of the NAND-type EEPROM device of FIG. 2A, taken along the bit line direction. As illustrated by FIG. 2B, each bit line 148 is electrically connected to a drain region 136a of a corresponding string selection transistor (SST) within a corresponding NAND-type string of EEPROM cells. This electrical connection is provided by a bit line contact plug 146 (e.g., metal plug), which extends through a stacked arrangement of a first interlayer dielectric layer 138 and a second interlayer dielectric layer 142. The string selection transistor (SST) also includes a source/drain region 134, gate oxide layer 110b, a lower string select gate electrode 120b, an insulating region 115b and an upper string select gate electrode 128b, which is electrically connected to the lower string select gate electrode 120b. The insulating region 115b is formed on an upper surface 119b of a lower portion of the lower string select gate electrode 120b. The upper string select gate electrode 128b is part of the string select line 132b illustrated by FIG. 2A. The upper string select gate electrode 128b is covered by an electrically insulating hard mask pattern 130b. Region 122b represents an inter-gate dielectric pattern having a contact opening 126a therein and region 124b is a lower conductive pattern. Regions 122b and 124b collectively form a buffer pattern 125a.

A ground selection transistor (GST) includes a source region 136b, which is electrically connected to the common source line 140, a source/drain region 134, gate oxide layer 110c, a lower ground select gate electrode 120c, an insulating region 115c and an upper ground select gate electrode 128c, which is electrically connected to the lower ground select gate electrode 120c. The insulating region 115c is formed on an upper surface 119c of a lower portion of the lower ground select gate electrode 120c. The upper ground select gate electrode 128c is part of the ground select line 132c illustrated by FIG. 2A. The upper ground select gate electrode 128c is covered by an electrically insulating hard mask pattern 130c. Region 122c represents an inter-gate dielectric pattern having a contact opening 126b therein and region 124c is a lower conductive pattern. Regions 122c and 124c collectively form a buffer pattern 125b.

FIG. 2B also illustrates a plurality of EEPROM cells within the NAND-type string associated with the corresponding bit line 148. These EEPROM cells extend in series between the ground selection transistor GST and the string selection transistor SST. Each EEPROM cell includes a pair of source/drain regions 134, a tunnel oxide layer 110a and a floating gate electrode 120a on the tunnel oxide layer 110a. The tunnel oxide layer 110a extends opposite a corresponding channel region within the substrate 100. Each channel region extends between a corresponding pair of source/drain regions within each EEPROM cell.

As described more fully hereinbelow, the floating gate electrode 120a, which has an open-ended wraparound shape, is filled with an electrically insulating region 115a. This electrically insulating region 115a extends on an upper surface 119a of a lower portion of the floating gate electrode 120a. An inter-gate dielectric pattern 122a is formed on the floating gate electrode 120a, as illustrated. The control gate electrode 132a, which represents a portion of a corresponding word line, comprises a composite of a lower conductive pattern 124a and an upper conductive pattern 128a. The upper conductive pattern 128a is covered by an electrically insulating hard mask pattern 130a.

Figure 2C:
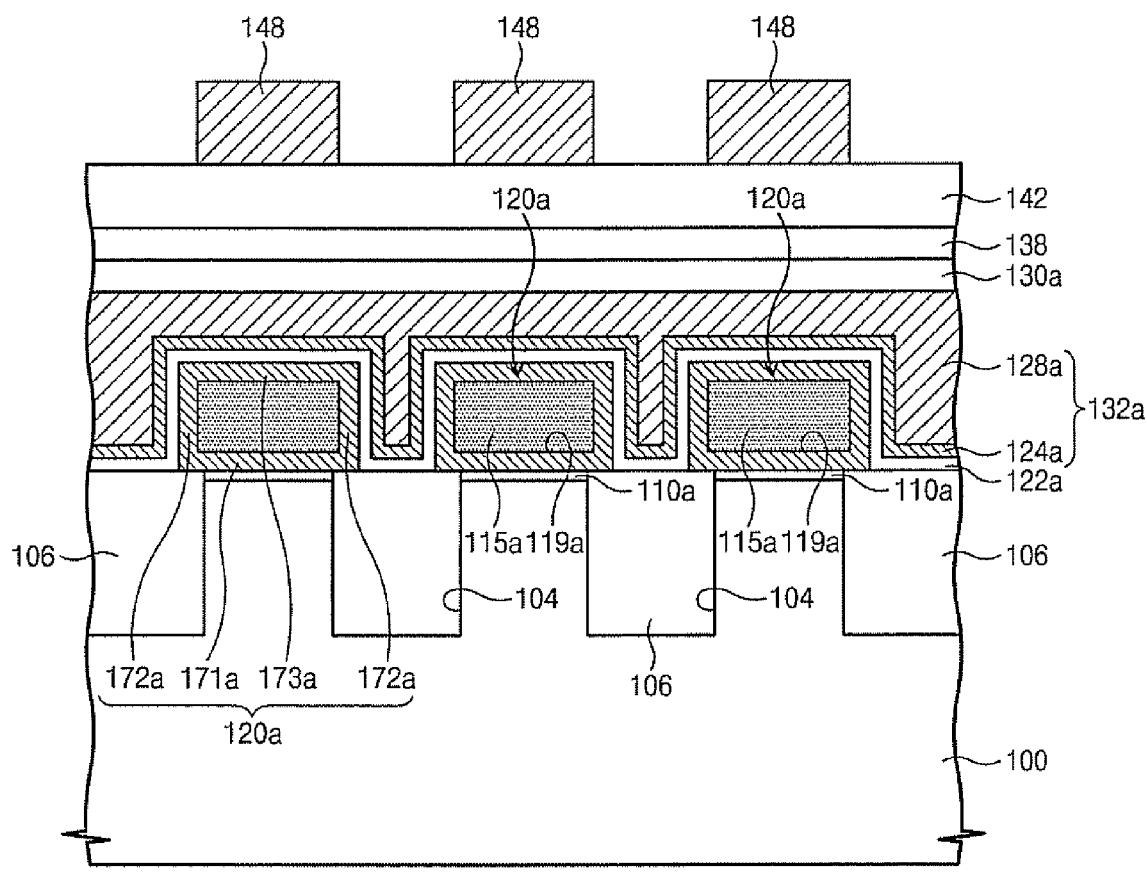
FIG. 2C is a cross-sectional view of the NAND-type EEPROM device of FIG. 2A, taken along the line C-C' in FIG. 2A.

A cross-sectional view of the NAND-type EEPROM device of FIG. 2A is illustrated by FIG. 2C. In particular, FIG. 2C illustrates a plurality of EEPROM cells that extend side-by-side in a word line direction (e.g., along line C-C' in FIG. 2A). This word line direction is illustrated as being orthogonal to the direction of the bit lines 148, which extend on top of the second interlayer dielectric layer 142. Each of these EEPROM cells includes an open-ended wraparound-shaped floating gate electrode 120a having a bottom electrode portion 171a, a top electrode portion 173a and side electrode portions 172a. These electrode portions collectively define a floating gate electrode having the shape of a rectangular cylinder, which has a longitudinal axis extending in the bit line direction. This rectangular cylinder is filled with the insulating region 115a.

As further illustrated by FIG. 2C, the source, drain and channel regions of each EEPROM cell are separate from the source, drain and channel regions of adjacent cells by corresponding isolation regions 106, which are located within shallow trenches 104. The tunnel oxide layer 110a also extends between the upper sidewalls of the shallow trenches 104. The inter-gate dielectric pattern 122a, the lower conductive pattern 124a, the upper conductive pattern 128a and the hard mask pattern 130a are illustrated as being continuous in the word line direction.

Figure 2D:
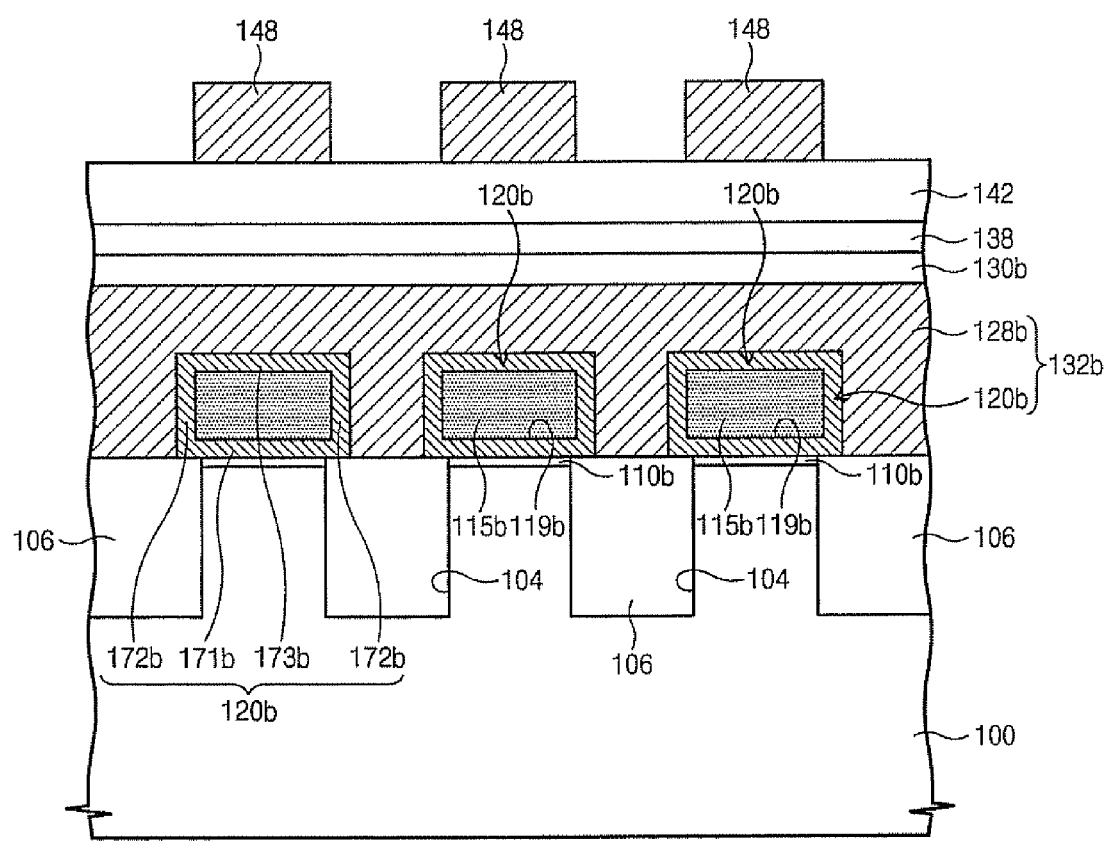
FIG. 2D is a cross-sectional view of the NAND-type EEPROM device of FIG. 2A, taken along the line D-D' in FIG. 2A.

A second cross-sectional view of the NAND-type EEPROM device of FIG. 2A is illustrated by FIG. 2D. In particular, FIG. 2D illustrates a plurality of string selection transistors (SST) that extend side-by-side in a word line direction (e.g., along line D-D' in FIG. 2A). Each of these string selection transistors includes an open-ended wraparound-shaped lower string select gate electrode 120b, an insulating region 115b and an upper string select gate electrode 128b (which represents a string selection word line). The lower string select gate electrode 120b includes a bottom electrode portion 171b, a top electrode portion 173b and side electrode portions 172b. These electrode portions collectively define a lower string select gate electrode having the shape of a rectangular cylinder. This rectangular cylinder is filled with the insulating region 115b.

Methods of forming the NAND-type EEPROM device of FIGS. 2A-2D will now be described more fully with respect to FIGS. 3A-3I and 4A-4I. In particular, FIGS. 3A-3I are cross-sectional views of intermediate structures of an EEPROM device taken along a bit line direction and FIGS. 4A-4I are cross-sectional views of the same EEPROM device taken along a word line direction. FIG. 3I corresponds generally to the right half of FIG. 2B and FIG. 4I corresponds generally to the cross-section shown in FIG. 2C.

Figure 3A:
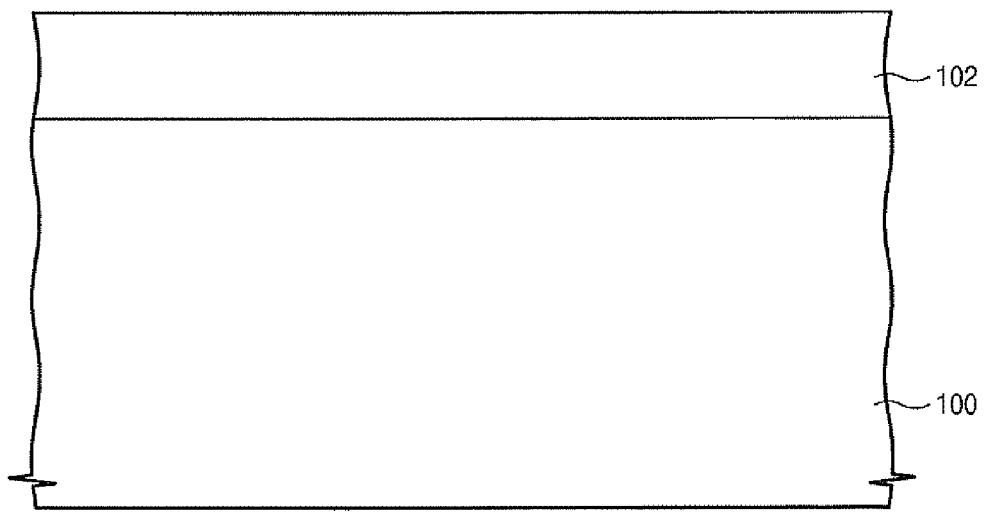
FIGS. 3A-3I and 4A-4I are cross-sectional views of intermediate structures that illustrate methods of forming EEPROM devices according to embodiments of the present invention.
Figure 4A:
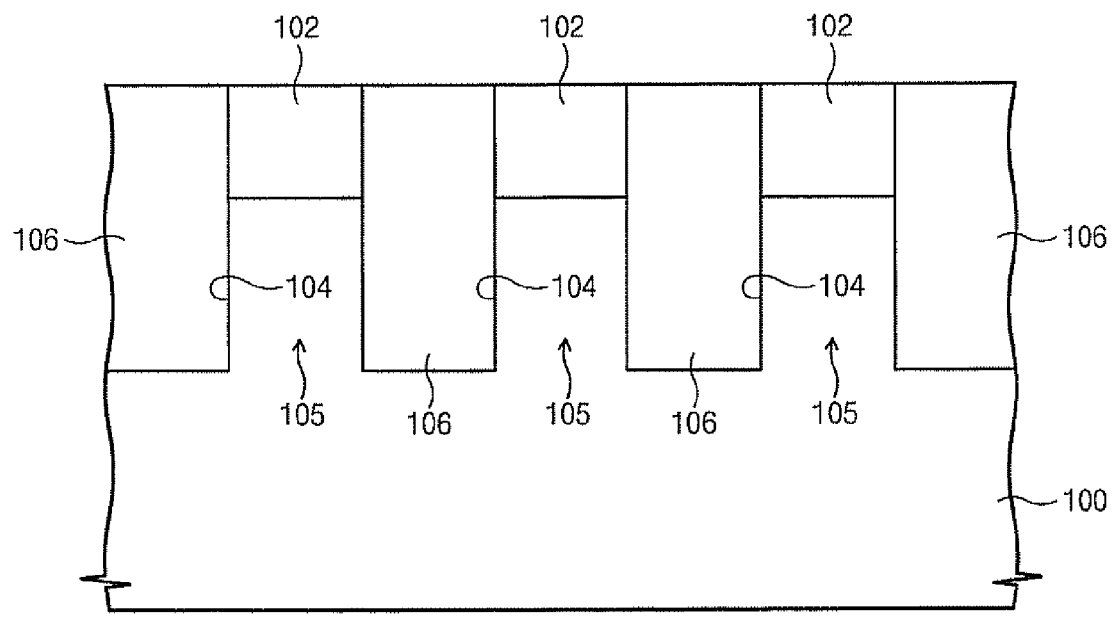

Referring now to FIGS. 3A and 4A, methods of forming a NAND-type EEPROM device according to embodiments of the invention include forming a hard mask pattern 102 on a primary surface of a semiconductor substrate 100. This hard mask pattern 102 may be formed by depositing a composite layer of silicon nitride and silicon oxide having a thickness in a range from about 300 Å to about 2000 Å on the semiconductor substrate 100 and then photolithographically patterning the deposited layer. Active regions 105 are then defined within the substrate 100 by selectively etching shallow trenches 104 into the substrate 100, using the hard mask pattern 102 as an etching mask. These trenches 104 are then filled with a trench isolation material (e.g., oxide). This filling of the trenches 104 may be performed by depositing an electrically insulating layer into the trenches 104 and then planarizing or otherwise etching back the deposited insulating layer to be planar with an upper surface of the hard mask pattern 102. This planarization step results in the definition of a plurality of trench isolation regions 106 within the substrate 100.

Figure 3B:
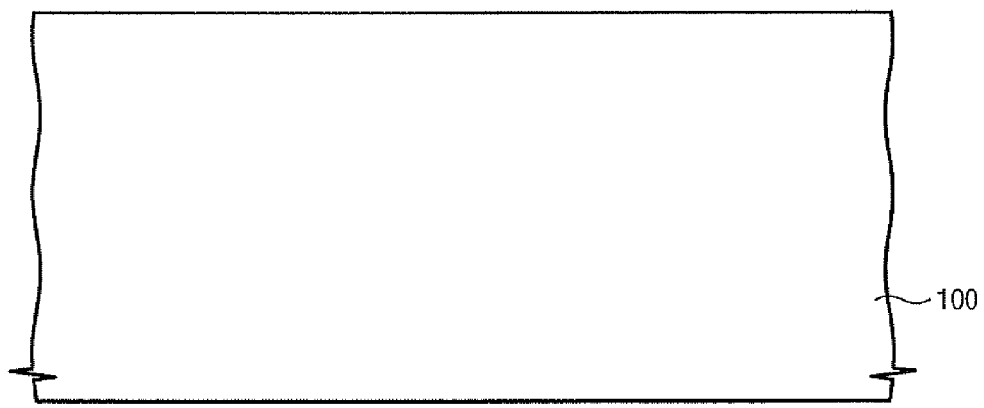
Figure 3C:
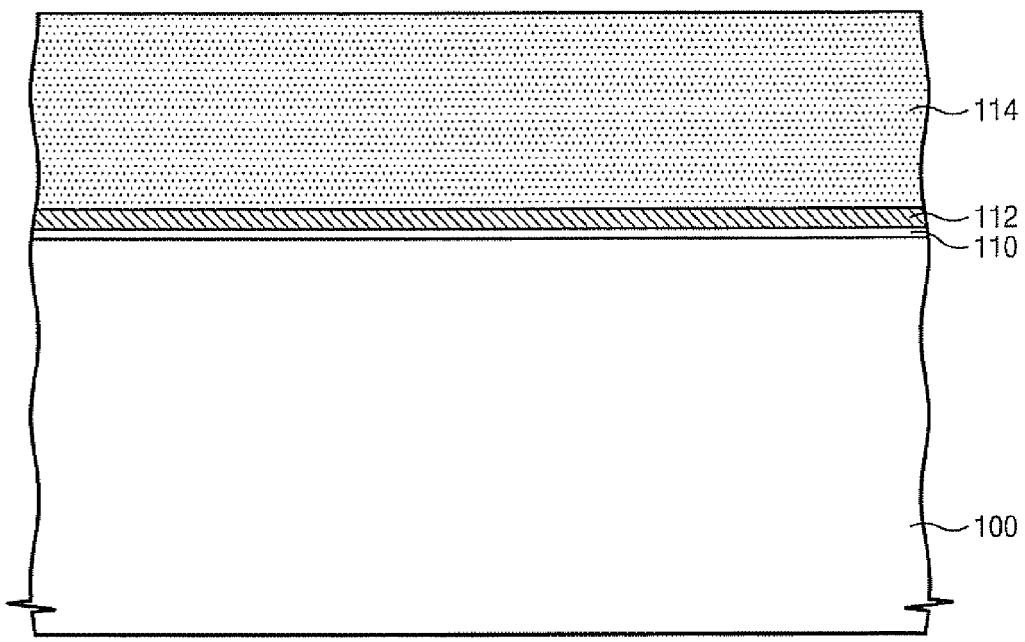
Figure 4B:
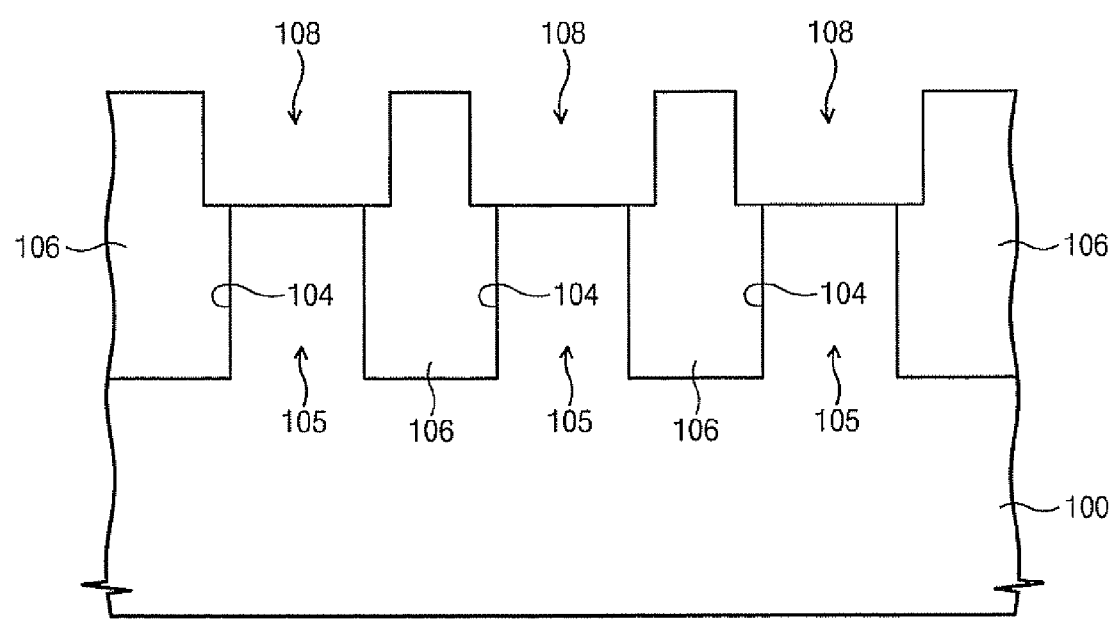
Figure 4C:
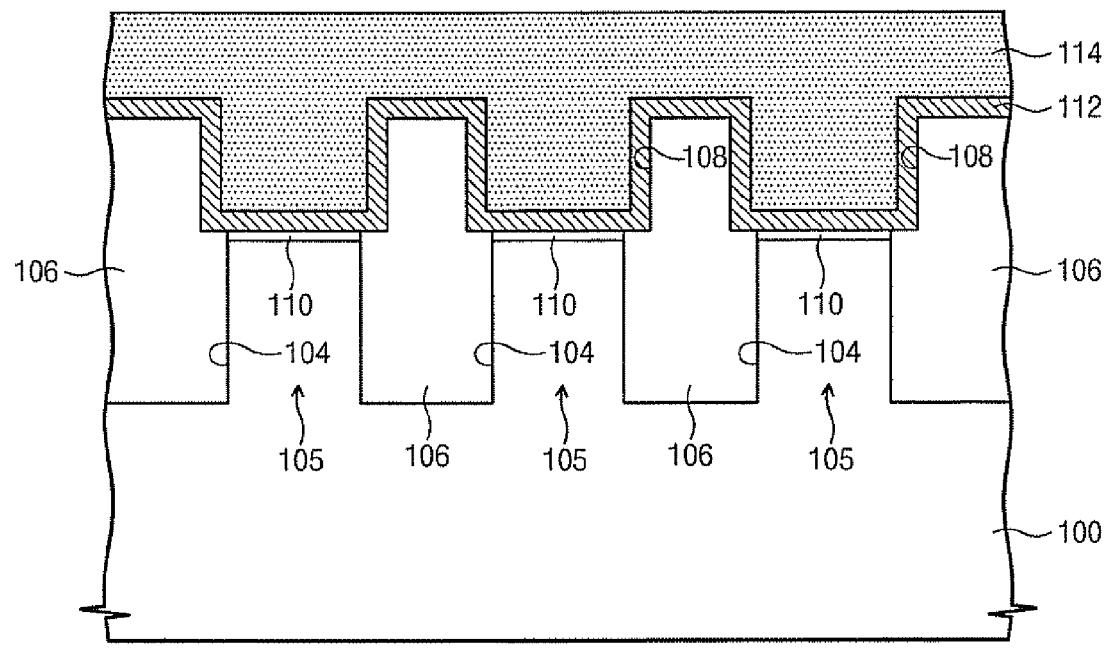

As illustrated by FIGS. 3B and 4B, the hard mask pattern 102 is then removed to expose recesses 108 within the trench isolation regions 106. Then, as shown by FIGS. 3C and 4C, a plurality of layers are formed on the substrate 100. These layers include a plurality of tunnel oxide layers 110, which may be formed by thermally oxidizing exposed portions of the active regions 105. These tunnel oxide layers 110 may have a thickness in a range from about 60 Å to about 100 Å. A first polysilicon layer 112 is then conformally deposited on the trench isolation regions 106 and the tunnel oxide layers 110, as illustrated. This first polysilicon layer 112 may be a doped or undoped layer having a thickness in a range from about 50 Å to about 200 Å. Next, a relatively thick electrically insulating layer 114 is conformally deposited on the first polysilicon layer 112. This electrically insulating layer 114 may have a thickness in a range from about 200 Å to about 1000 Å, which is sufficient to completely fill the recesses 108.

Figure 3D:
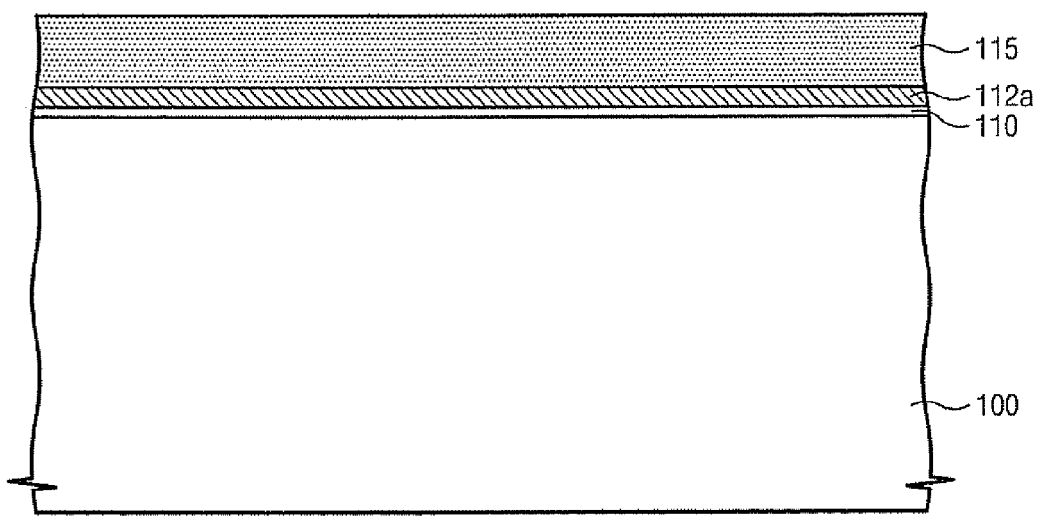
Figure 4D:
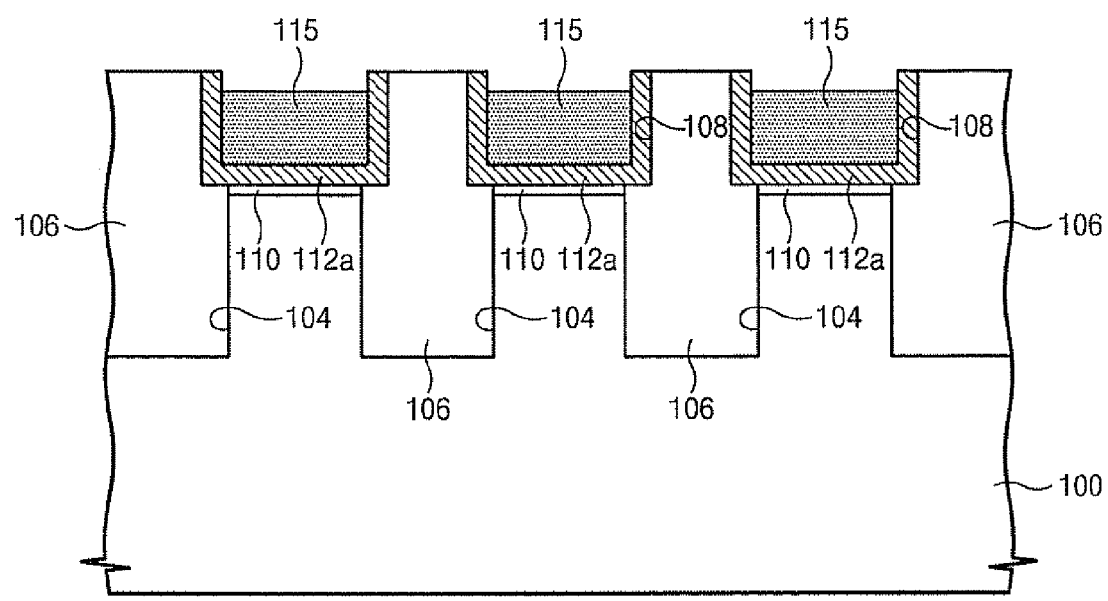

Referring now to FIGS. 3D and 4D, the electrically insulating layer 114 and the first polysilicon layer 112 are then planarized by an etch-back or chemical mechanical polishing (CMP) process. This planarization step is performed for a sufficient duration to expose upper surfaces of the trench isolation regions 106 and define a plurality of first polysilicon patterns 112a. The planarized upper surface of the electrically insulating layer 114 is also further etched-back slightly to define a plurality of insulating regions 115 within the recesses 108. As illustrated, upper surfaces of these insulating regions 115 are recessed relative to the upper surfaces of the trench isolation regions 106.

Figure 3E:
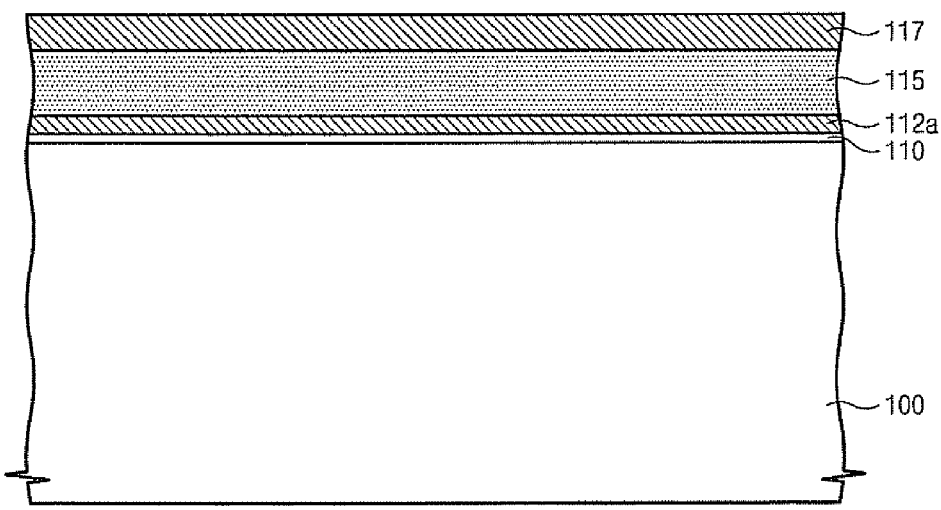
Figure 3F:
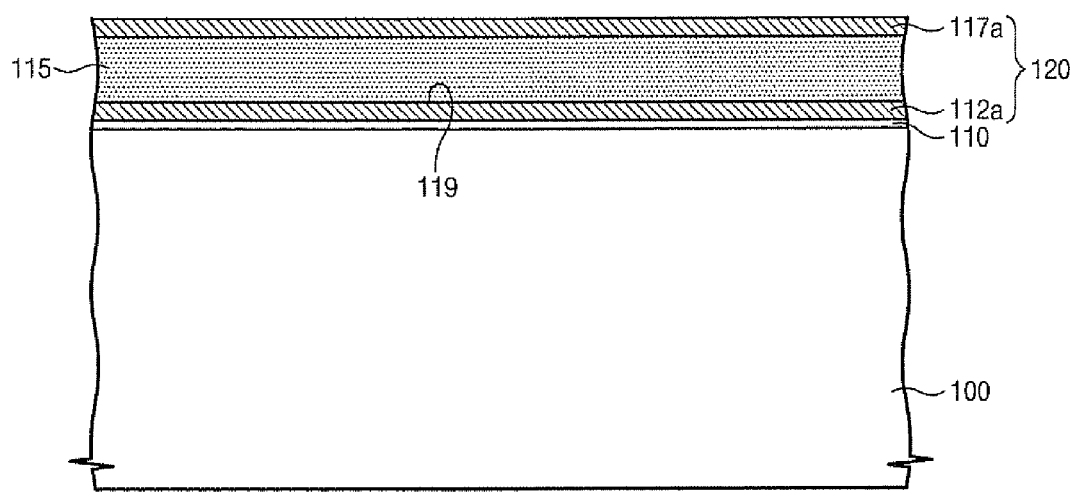
Figure 4E:
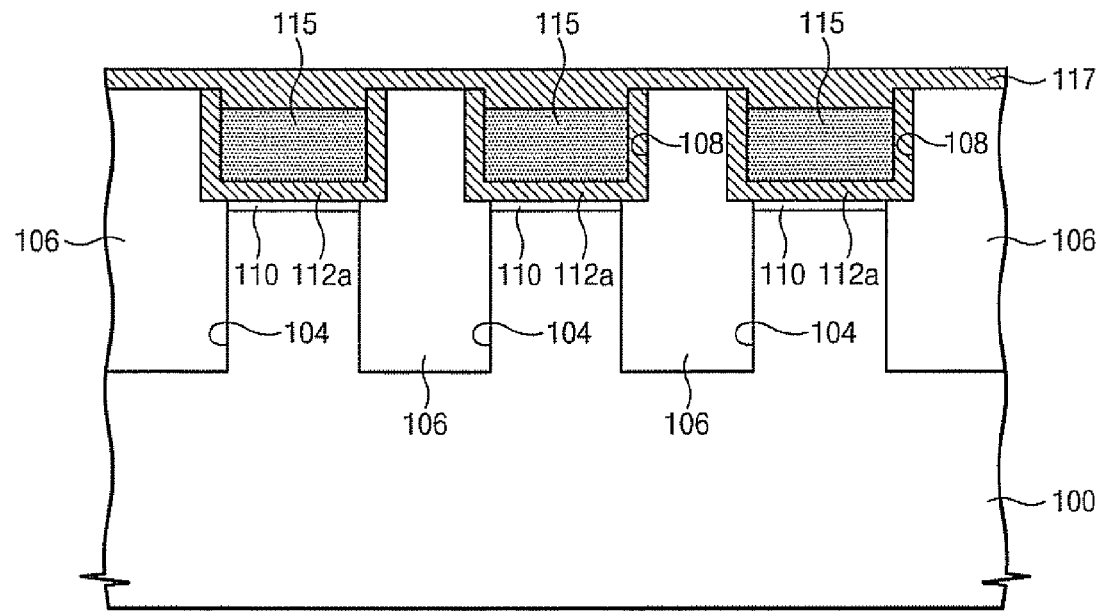
Figure 4F:
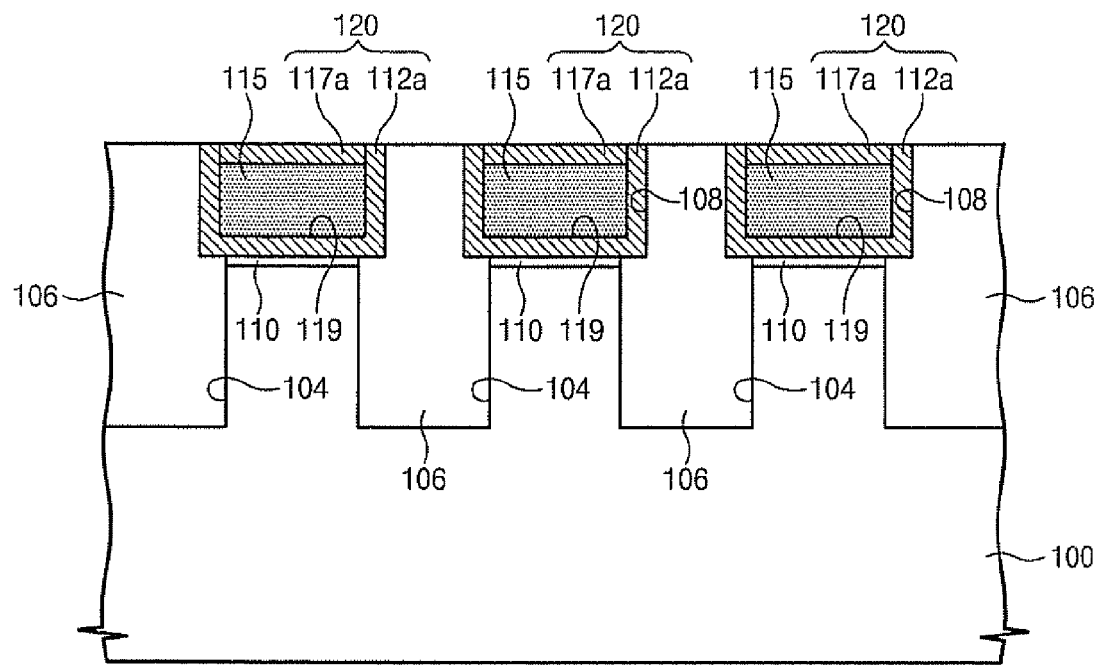

Thereafter, as illustrated by FIGS. 3E and 4E, a second polysilicon layer 117 is conformally deposited on the structures of FIGS. 3D and 4D. In particular, the second polysilicon layer 117 is deposited on the trench isolation regions 106, the insulating regions 115 and the first polysilicon patterns 112a. The second polysilicon layer 117 is then planarized to define a plurality of second polysilicon patterns 117a, which have an upper surface that is planar with an upper surface of the trench isolation regions 106. As illustrated by FIGS. 3F and 4F, each of the second polysilicon patterns 117a and a corresponding one of the first polysilicon patterns 112a collectively form a corresponding preliminary floating gate electrode pattern 120. As shown by FIG. 3F, each preliminary floating gate electrode pattern 120 extends in a bit line direction for the full length of a NAND string (i.e., across multiple EEPROM cells).

Figure 3G:
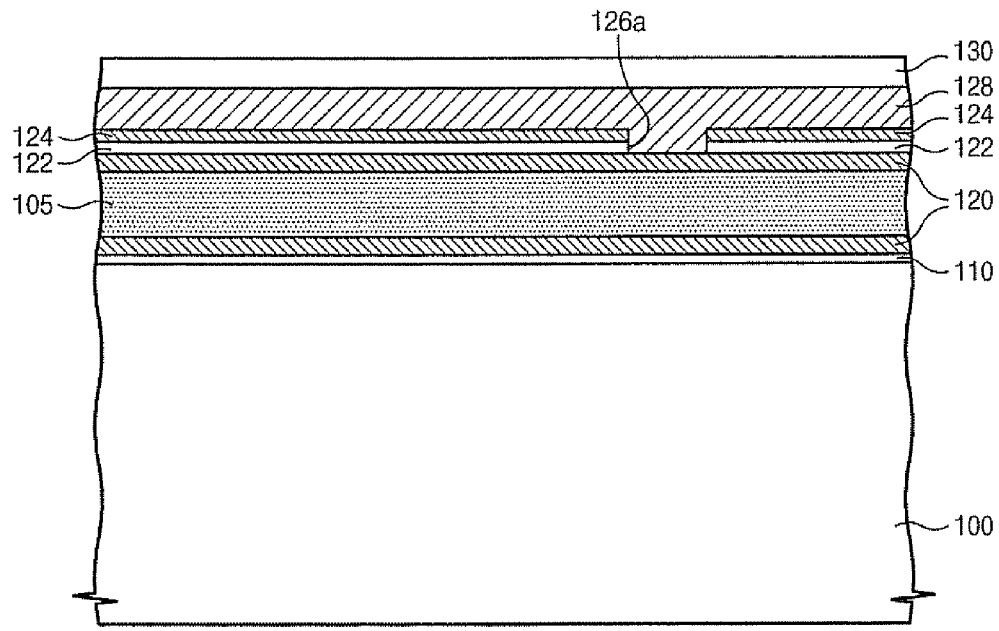
Figure 4G:
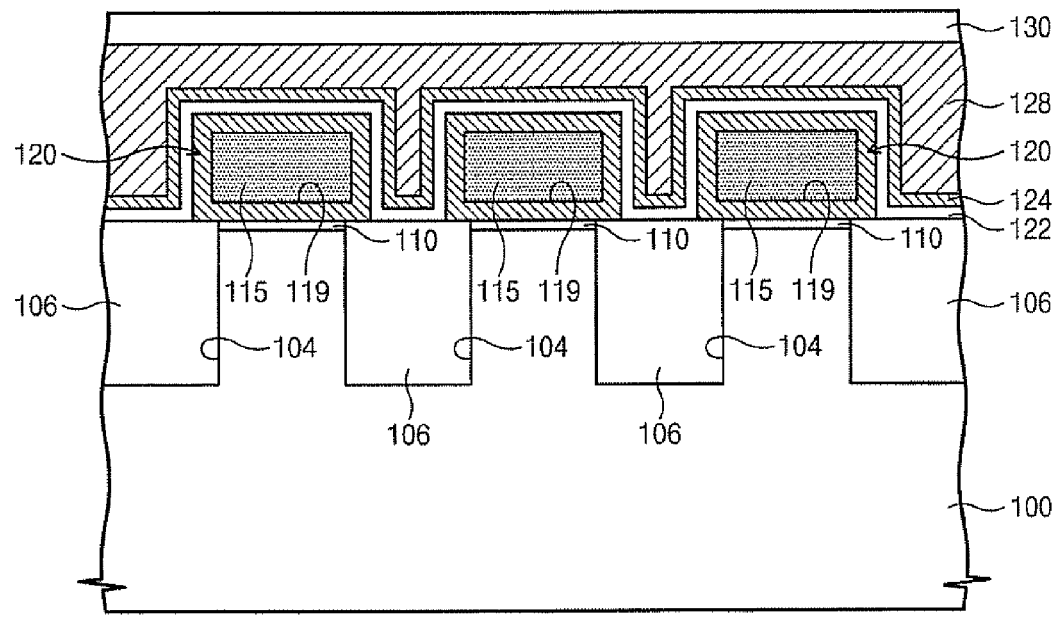

Referring now to FIGS. 3G and 4G, a selective etch-back step is performed to recess the trench isolation regions 106 and fully expose sidewalls of first polysilicon patterns 112a. Then, an inter-gate dielectric layer 122 and a lower conductive layer 124 (e.g., third polysilicon layer) are sequentially deposited onto the preliminary floating gate electrode patterns 120 and recessed trench isolation regions 106, as illustrated. The inter-gate dielectric layer 122 may be formed as an oxide-nitride-oxide (ONO) layer having a thickness in a range from about 100 Å to about 200 Å and the lower conductive layer 124 may be formed as a doped polysilicon layer having a thickness in a range from about 30 Å to about 200 Å.

A selective etching step is then performed to define a contact opening 126a (and contact opening 126b, not shown in FIG. 3G) that extends through the lower conductive layer 124 and the inter-gate dielectric layer 122 and exposes an upper surface of a corresponding preliminary floating gate electrode pattern 120. An upper conductive layer 128 (e.g., fourth polysilicon layer) and an electrically insulating hard mask layer 130 are then conformally deposited, as illustrated. The upper conductive layer 128 may be formed to have a thickness in a range from about 200 Å to about 1000 Å and the hard mask layer 130 may be formed as a silicon oxide layer having a thickness in a range from about 500 Å to about 2500 Å.

Figure 3H:
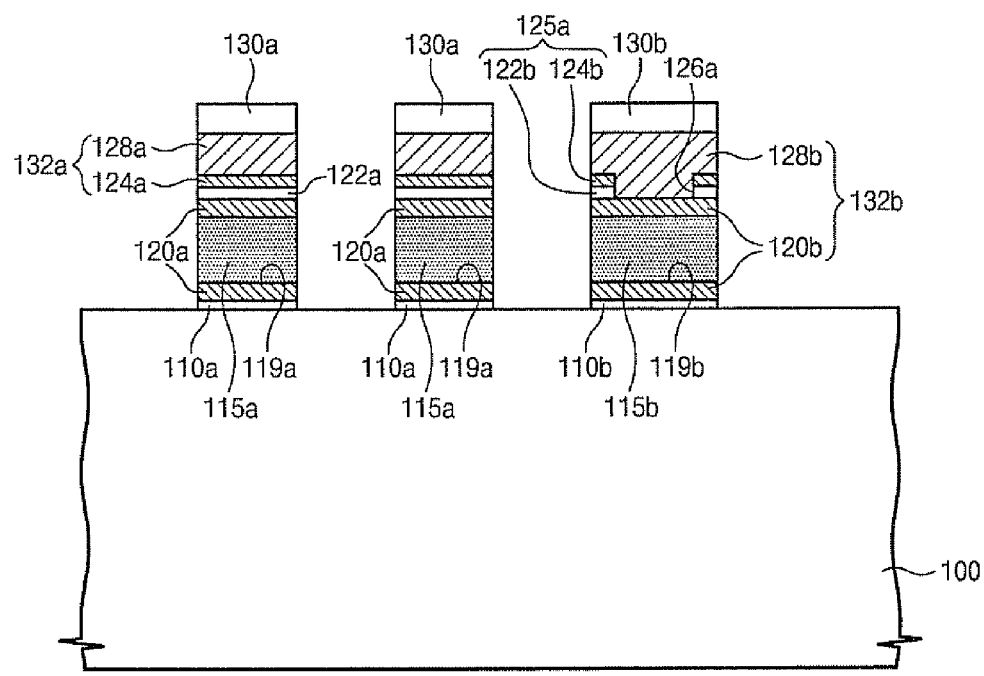
Figure 3I:
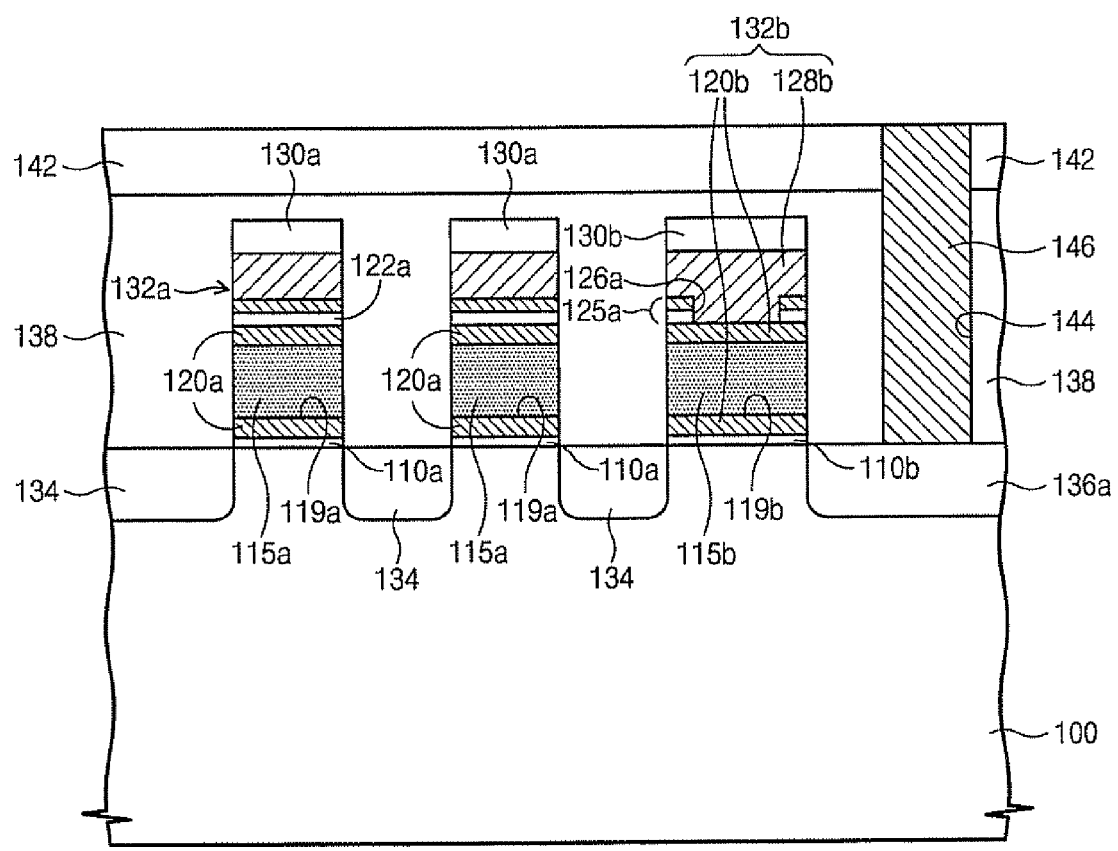
Figure 4H:
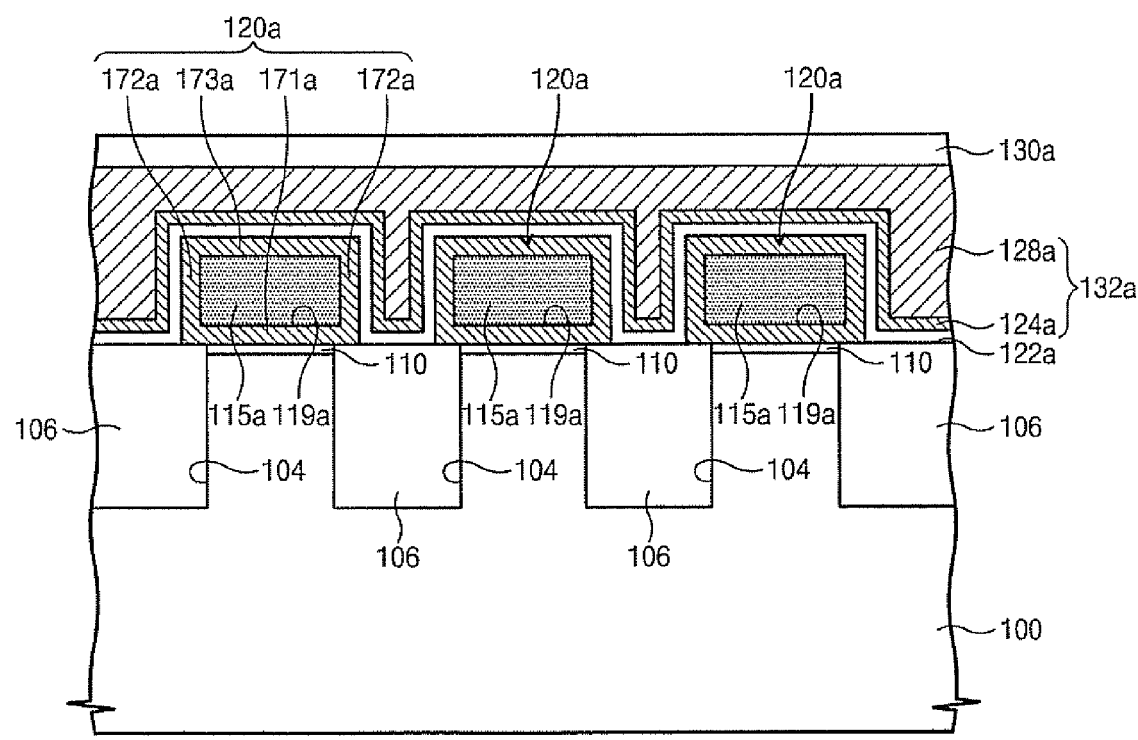

As illustrated by FIGS. 3H and 4H, a selective etching step(s) is performed to sequentially etch through the hard mask layer 130, the upper conductive layer 128, the lower conductive layer 124, the inter-gate dielectric layer 122, the preliminary floating gate electrode patterns 120 and the insulating regions 115, which fill the preliminary floating gate electrode patterns 120. These selective etching step(s) results in the definition of the hard mask patterns 130a, 130b (and 130c shown in FIG. 2B), a plurality of word lines 132a and floating gate electrodes 120a of the EEPROM cells and a string select line 132b, which connects the gate electrodes of the string select transistors (SST) within a corresponding row. The ground select line 132c (not shown in FIG. 3H, but shown in FIG. 2B) is also defined. These selective etching step(s) also defines the electrically insulating regions 115a within the floating gate electrodes 120a and the insulating region 115b associated with the string select transistor (SST). As described above with respect to FIG. 2D, each floating gate electrode 120a has a bottom electrode portion 171a, a top electrode portion 173a and side electrode portions 172a, as illustrated by FIG. 4H.

Figure 4I:
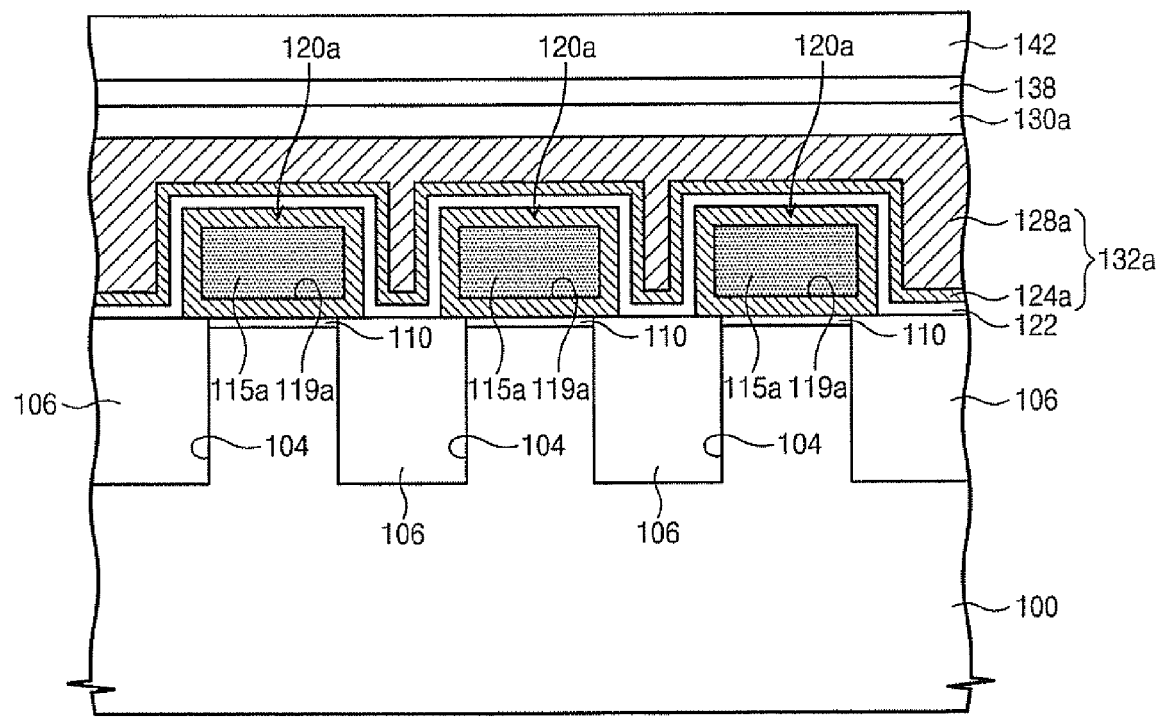

Referring now to FIGS. 2B, 3I and 4I, a selective ion-implanting/drive-in step is performed to define the source/drain regions of the EEPROM cells, string select transistors and ground select transistors. These source/drain regions are illustrated best by the reference numerals 134, 136a and 136b in FIG. 2B. After these regions have been formed, a first inter-layer dielectric layer 138 is formed on the substrate 100. This first inter-layer dielectric layer 138 may be silicon oxide layer having a thickness in a range from about 3000 Å to about 8000 Å. As illustrated by FIG. 2B, the first inter-layer dielectric layer 138 may be patterned to define a contact opening therein and a common source line 140 may be formed in the contact opening. This common source line 140 is electrically connected to the source region 136b of each of the ground select transistors (GST) within a plurality of the NAND strings. A second inter-layer dielectric layer 142 is also formed on the first inter-layer dielectric layer 138 and on the common source line 140. This second inter-layer dielectric layer 142 may be silicon oxide layer having a thickness in a range from about 500 Å to about 2000 Å. A selective etching step is then performed to define a bit line contact opening 144 that extends through the fist and second inter-layer dielectric layers and exposes the drain region 136a of the string selection transistor (SST). This bit line contact opening 144 is then filled with a bit line contact plug 146.

Figure 5A:
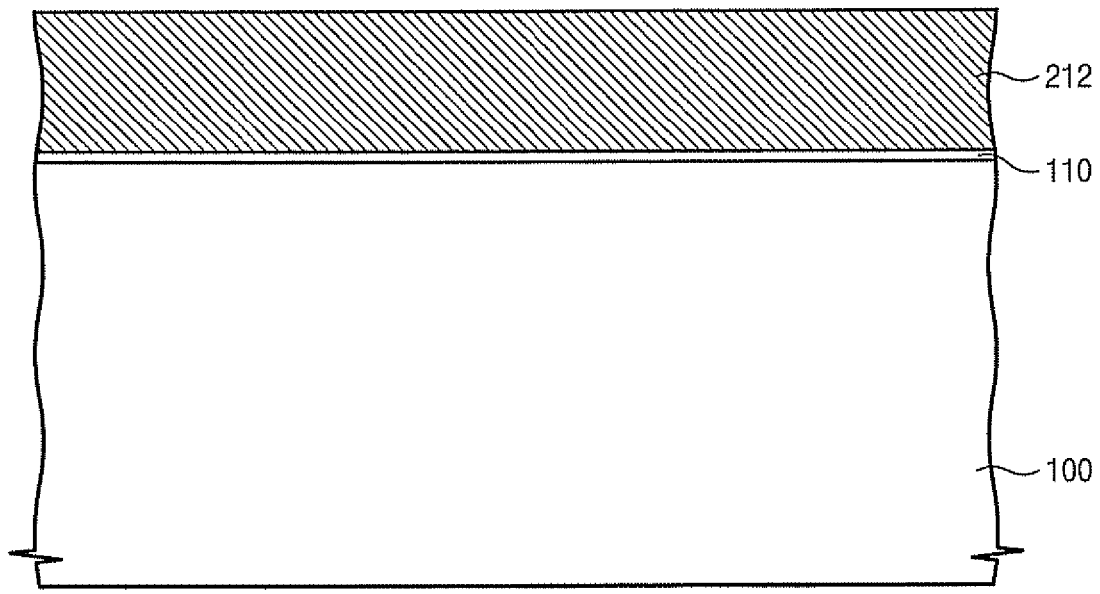
FIGS. 5A-5E and 6A-6E are cross-sectional views of intermediate structures that illustrate methods of forming EEPROM devices according to embodiments of the present invention.
Figure 5B:
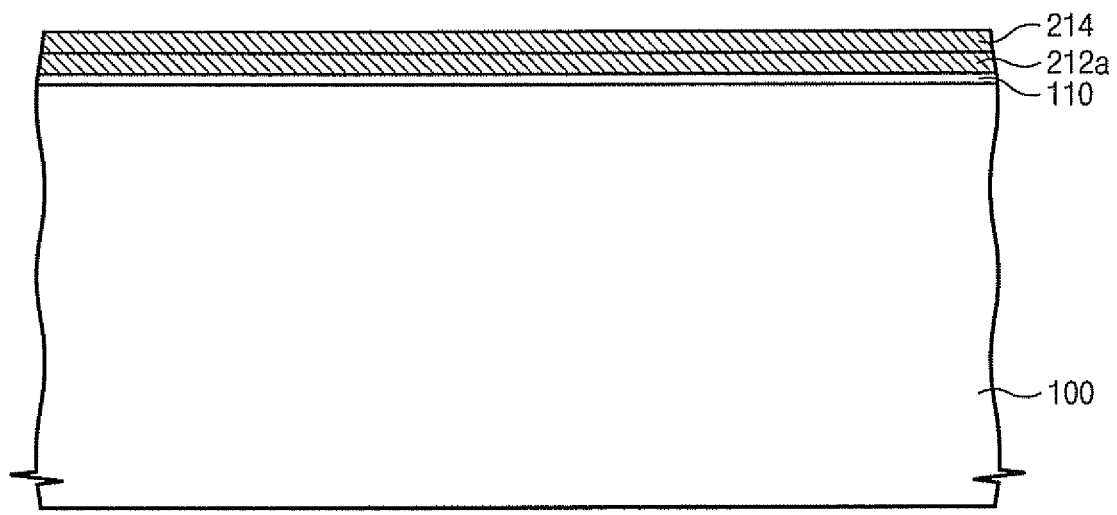
Figure 5C:
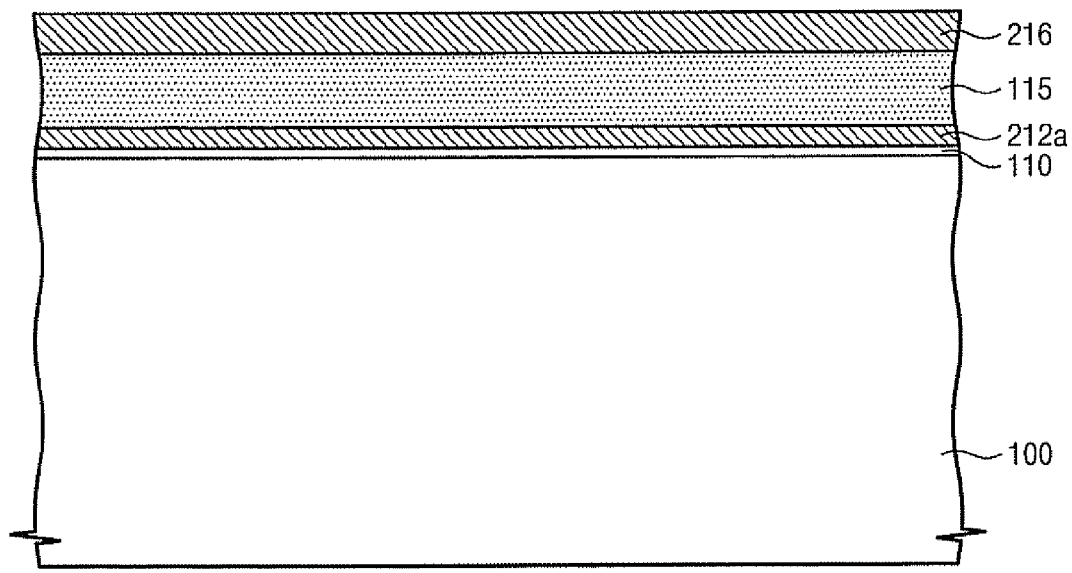
Figure 5D:
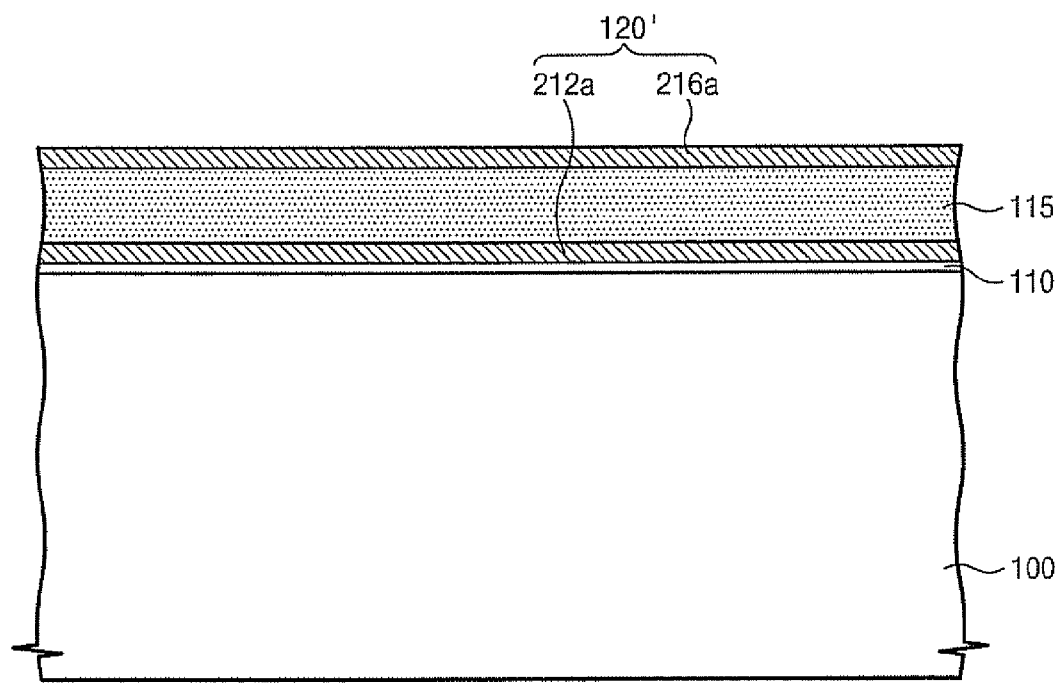
Figure 5E:
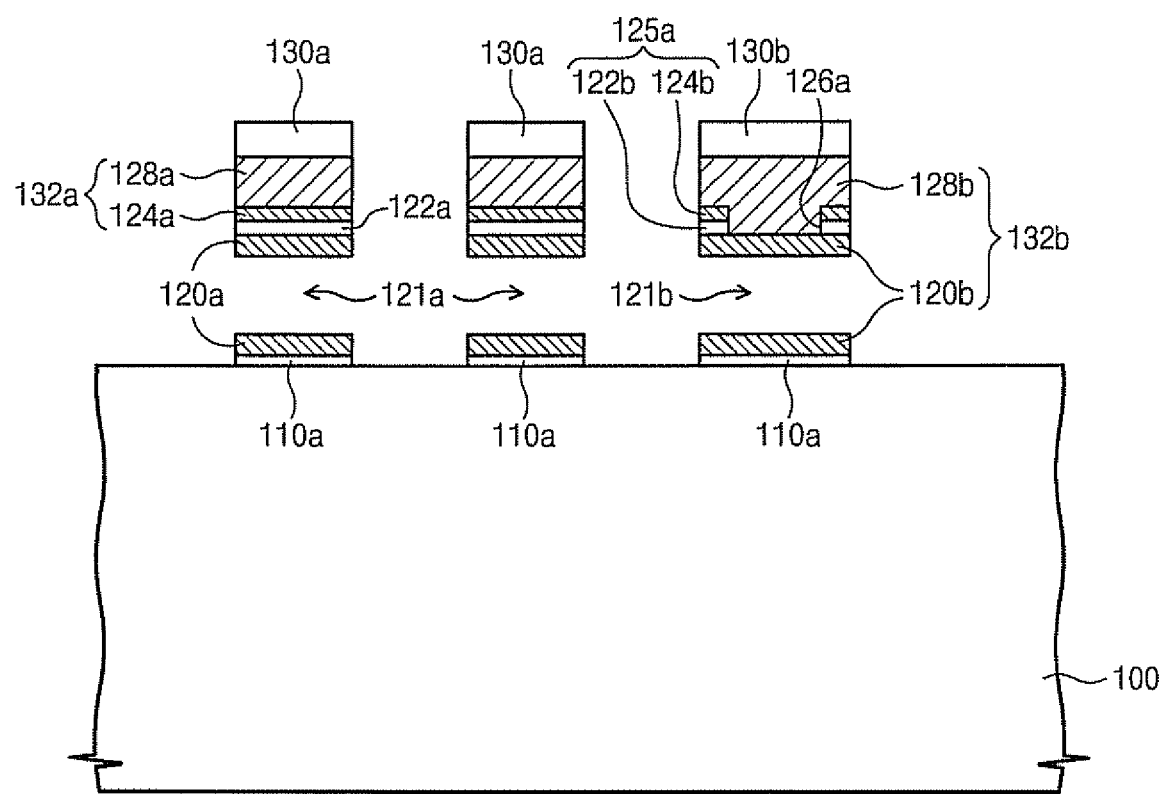
Figure 6A:
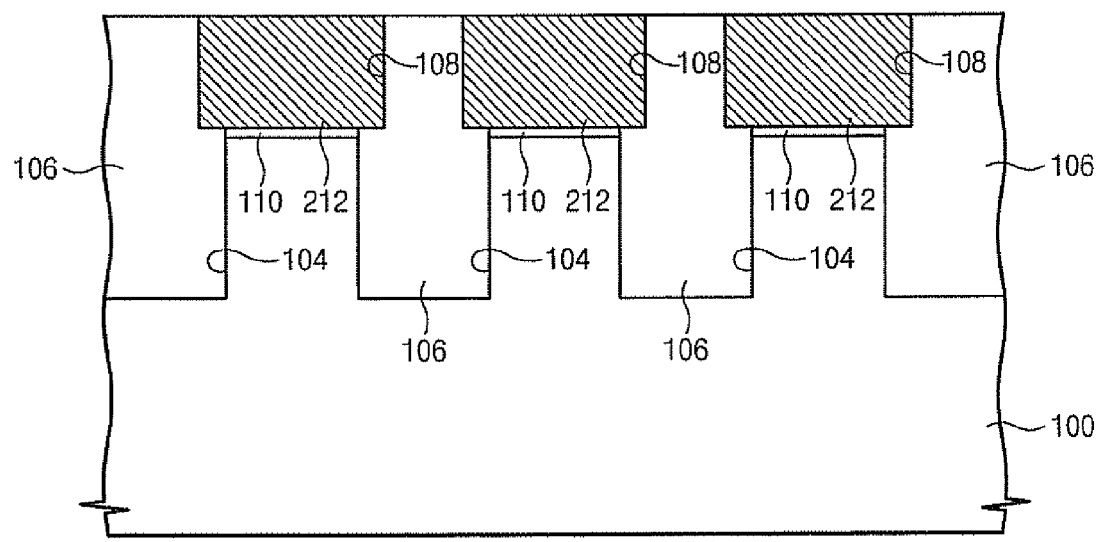
Figure 6B:
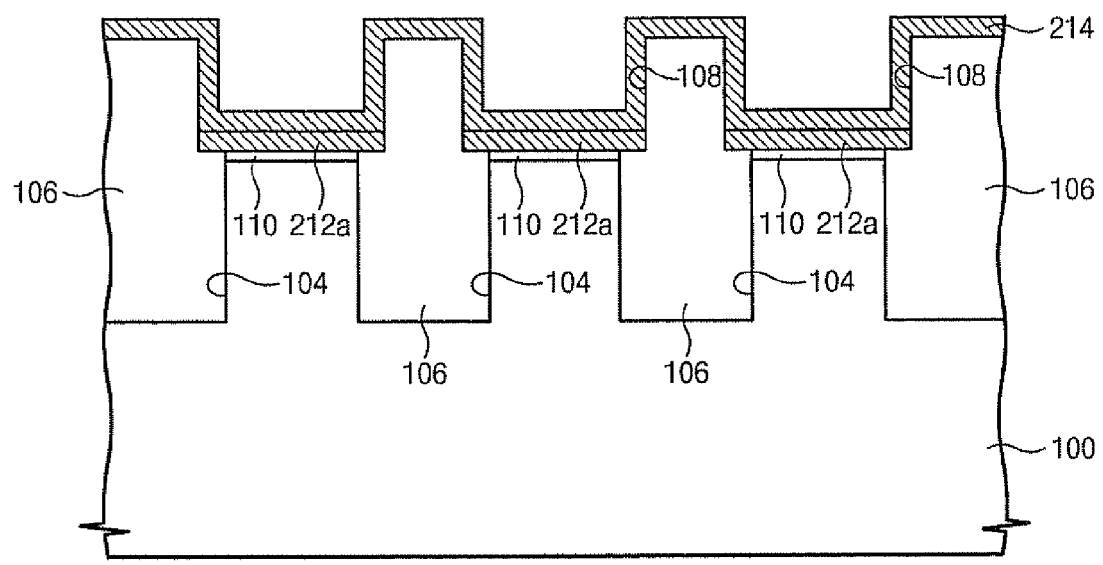

Additional methods of forming EEPROM devices according to embodiments of the invention are illustrated by FIGS. 5A-5E and 6A-6E. In particular, FIGS. 5A and 6A illustrate steps to form tunnel oxide patterns 110 and a polysilicon pattern 212 on the structures illustrated by FIGS. 3B and 4B. This polysilicon pattern 212 may be formed by depositing a blanket polysilicon layer and then planarizing the layer for a sufficient duration to expose upper surfaces of the trench isolation regions 106. Referring now to FIGS. 5B and 6B, this polysilicon pattern 212 is etched back to define a plurality of relatively thin polysilicon patterns 212a on corresponding ones of the tunnel oxide patterns 110. Another polysilicon layer 214 is then conformally deposited on the tunnel oxide regions 106 and on the polysilicon patterns 212a.

Figure 6C:
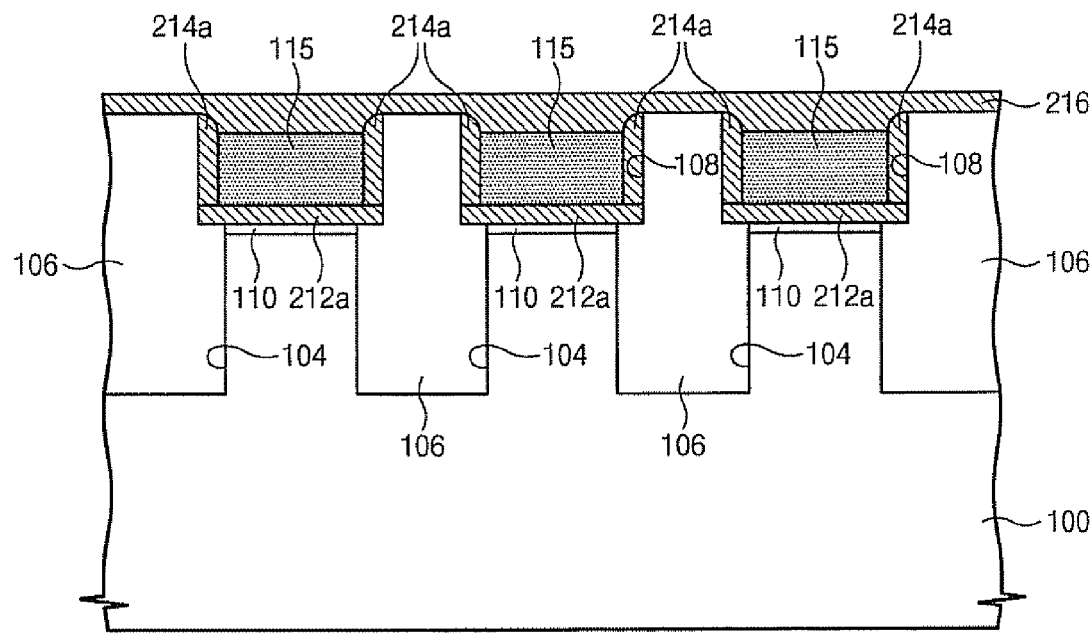

As illustrated by FIGS. 5C and 6C, the polysilicon layer 214 is selectively etched back to form polysilicon sidewall spacers 214a on sidewalls of the openings 108 in the trench isolation regions 106. An electrically insulating layer is then deposited into the openings and onto the trench isolation regions and then planarized and etched-back to define a plurality of insulating regions 115 having upper surfaces that are recessed within corresponding ones of the openings 108. A polysilicon layer 216 is then conformally deposited onto the trench isolation regions 106 and onto the plurality of insulating regions 115. This polysilicon layer 216 is of sufficient thickness to completely fill the openings 108.

Figure 6D:
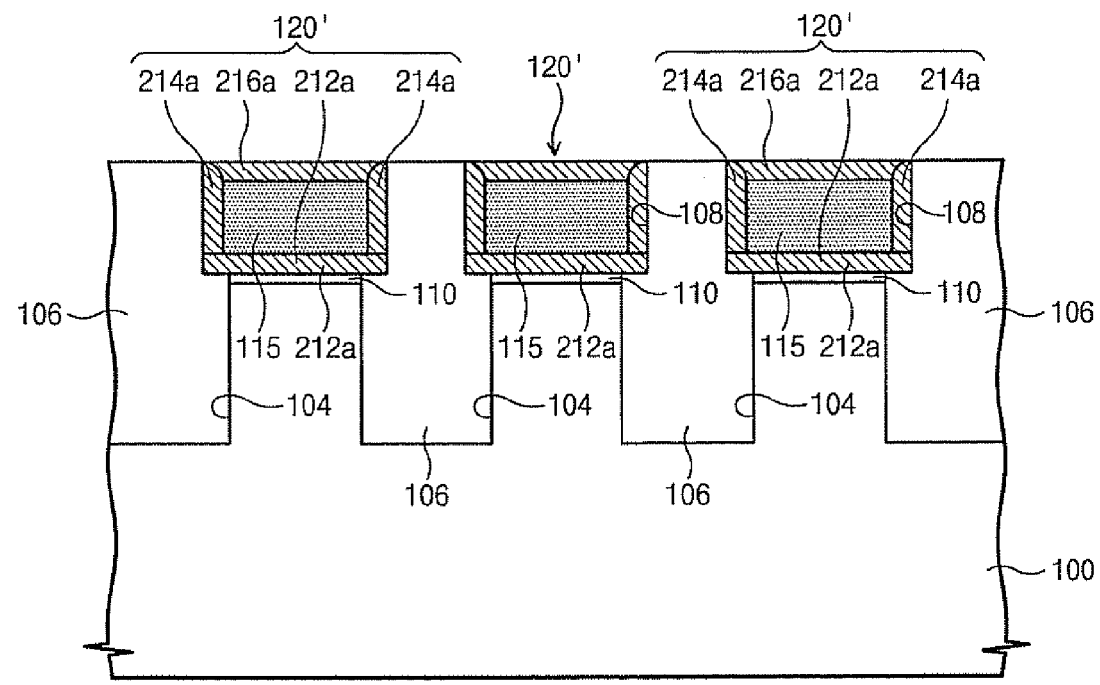

Referring now to FIGS. 5D and 6D, the polysilicon layer 216 is then planarized for a sufficient duration to expose the trench isolation regions 106 and thereby define a plurality of polysilicon patterns 216a. This planarization step may include a chemical mechanical polishing and/or chemical etch-back process. This planarization of the polysilicon layer 216 results in the definition of a plurality of preliminary floating gate electrode structures 120'. Each of these preliminary floating gate electrode structures 120' includes a corresponding polysilicon pattern 216a, a pair of polysilicon sidewall spacers 214a and a polysilicon pattern 212a.

Figure 6E:
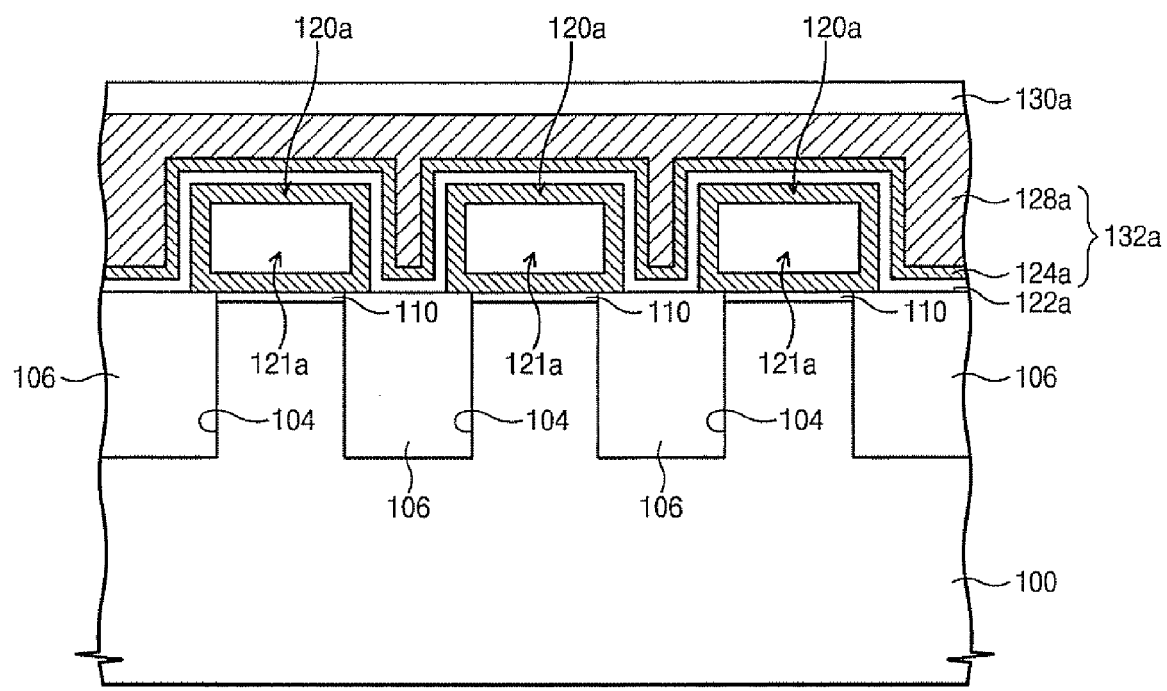

The structures of FIGS. 5D and 6D, which are similar to the structures of FIGS. 3F and 4F, undergo the further processing illustrated and described above with respect to FIGS. 3G-3H and 4G-4H. However, as illustrated by FIGS. 5E and 6E, the insulating regions 115 are removed by etching (e.g., wet etching) to thereby define a plurality of tunnel paths 121a and 121b associated with the EEPROM cells and string selection and ground selection transistors.

Thereafter, as illustrated by FIGS. 2B, 3I and 4I, a selective ion-implanting/drive-in step is performed to define the source/drain regions of a plurality of the EEPROM cells, string select transistors and ground select transistors (not shown in FIG. 4I). These source/drain regions are illustrated best by the reference numerals 134, 136a and 136b in FIG. 2B. After these regions have been formed, a first inter-layer dielectric layer 138 is formed on the substrate 100. This first inter-layer dielectric layer 138, which may be silicon oxide layer having a thickness in a range from about 2000 Å to about 8000 Å, is also provided to refill the tunnel paths 121a and 121b.

Then, as illustrated by FIG. 2B, the first inter-layer dielectric layer 138 may be patterned to define a contact opening therein and a common source line 140 may be formed in the contact opening. This common source line 140 is electrically connected to the source region 136b of each of the ground select transistors (GST) within a plurality of the NAND strings. A second inter-layer dielectric layer 142 is also formed on the first inter-layer dielectric layer 138 and on the common source line 140. A selective etching step is then performed to define a bit line contact opening 144 that extends through the fist and second inter-layer dielectric layers and exposes the drain region 136a of the string selection transistor (SST). This bit line contact opening 144 is then filled with a bit line contact plug 146.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A non-volatile memory cell, comprising:
   a semiconductor substrate having an active region therein that comprises source and drain regions of first conductivity type and a channel region extending between the source and drain regions;
   a tunnel insulating layer on the channel region;
   a control gate electrode on said semiconductor substrate;
   a floating gate electrode on said tunnel insulating layer, said floating gate electrode having an open-ended wraparound shape that is filled with an electrically insulating region, said open-ended wraparound shape being symmetrical about a longitudinal axis that extends in parallel across said semiconductor substrate in a drain-to-source direction so that open ends of said floating gate electrode have faces extending orthogonal to a surface of said semiconductor substrate on which said floating gate electrode extends; and
   an inter-gate dielectric layer extending between a portion of said floating gate electrode and said control gate electrode.

2. The memory cell of claim 1, wherein said floating gate electrode has a rectangular cylinder shape.

3. The memory cell of claim 1, wherein the electrically insulating region comprises CVD silicon oxide.

4. A non-volatile memory cell, comprising:
   a semiconductor substrate having an active region therein that comprises source and drain regions of first conductivity type and a channel region extending between the source and drain regions;
   a tunnel insulating layer on the channel region;
   a cylinder-shaped floating gate electrode that extends on said tunnel insulating layer and is filled with an electrically insulating region, said cylinder-shaped floating gate electrode being symmetrical about a longitudinal axis that extends in parallel across said semiconductor substrate in a drain-to-source direction so that open ends of said cylinder-shaped floating gate have faces extending orthogonal to a surface of said semiconductor substrate on which said cylinder-shaped floating gate extends;
   a control gate electrode on said cylinder-shaped floating gate electrode; and
   an inter-gate dielectric layer extending between said cylinder-shaped floating gate electrode and said control gate electrode.

5. The memory cell of claim 4, wherein the electrically insulating region comprises CVD silicon oxide.

* * * * *